United States Patent [19]
Kuo

[11] Patent Number: 5,539,341
[45] Date of Patent: Jul. 23, 1996

[54] CMOS BUS AND TRANSMISSION LINE DRIVER HAVING PROGRAMMABLE EDGE RATE CONTROL

[75] Inventor: James R. Kuo, Cupertino, Calif.

[73] Assignee: National Semiconductor Corporation, Santa Clara, Calif.

[21] Appl. No.: 146,617

[22] Filed: Nov. 2, 1993

Related U.S. Application Data

[63] Continuation-in-part of Ser. No. 73,304, Jun. 8, 1993, abandoned.

[51] Int. Cl.$^6$ .............................. H03K 3/00; H03K 17/16
[52] U.S. Cl. ...................... 327/108; 327/110; 327/379; 327/389; 327/391; 326/21; 326/30
[58] Field of Search ................................ 307/270, 246, 307/571, 572, 573, 585, 443, 451, 591; 327/108, 110, 379, 380, 381, 387, 389, 391; 326/21, 24, 30

[56] References Cited

U.S. PATENT DOCUMENTS

| | | | |
|---|---|---|---|
| 3,333,113 | 7/1967 | Cole et al. | 307/88.5 |
| 4,254,501 | 3/1981 | Griffith et al. | 375/9 |
| 4,385,394 | 5/1983 | Pace | 375/36 |
| 4,393,494 | 7/1983 | Belforte et al. | 370/27 |
| 4,419,594 | 12/1983 | Gemmell et al. | 327/538 |

(List continued on next page.)

FOREIGN PATENT DOCUMENTS

| | | | |
|---|---|---|---|
| 0199374 | 10/1986 | European Pat. Off. | H03K 19/094 |
| 0351820 | 1/1990 | European Pat. Off. | |
| 0504983A1 | 9/1992 | European Pat. Off. | |
| 0557080A1 | 8/1993 | European Pat. Off. | |
| 0575676A1 | 12/1993 | European Pat. Off. | |
| WO85/02507 | 6/1985 | WIPO | H03K 19/092 |
| WO85/04774 | 10/1985 | WIPO | H03K 19/086 |
| WO86/01055 | 2/1986 | WIPO | H03K 19/092 |
| WO89/00362 | 1/1989 | WIPO | |
| WO91/20129 | 12/1991 | WIPO | |

OTHER PUBLICATIONS

*Bill Gunning, "GTL Fact Sheet", Sep. 20, 1991, all pages.
*Paul R. Gray and Robert G. Meyer, "Analysis and Design of Analog Integrated Circuits", 1977, pp. 254–261.
*"Electronically Switchable Interface Circuit With Multiple EIA Protocol Drivers and Receivers", IBM Technical Disclosure Bulletin, vol. 30, No. 11, Apr. 1988, all pages.
*Boris Bertolucci, "Fastbus Dual–Port Memory and Display Diagnostic Module", IEEE Transactions on Nuclear Science, vol. NS–34, No. 1, Feb. 1987, pp. 253–257.

(List continued on next page.)

Primary Examiner—David C. Nelms
Assistant Examiner—Trong Phan
Attorney, Agent, or Firm—Limbach & Limbach

[57] ABSTRACT

A driver for providing binary signals from a data system to a transmission line and a method of charging and discharging the driver output transistor is disclosed. A preferred embodiment of the driver includes an output transistor having its drain-source circuit connectable between the transmission line and ground. An input stage provides a first charging current to the gate of the output transistor for a first charging time period and a first discharging current for discharging the gate of the output transistor for a first discharging time period. A first falling edge speed-up circuit provides a second charging current to the gate of the output transistor for a second charging time period to charge the voltage level of the gate of the output transistor to approximately its threshold voltage level. A gate charging speed-up circuit provides a third charging current to the gate of the output transistor for a third charging time period beginning when the driver output reaches a low logic level and ending when the voltage level of the gate of the output transistor increases to approximately a first voltage supply level. A rising edge discharge circuit provides a second discharging current for discharging the gate of the output transistor for a second discharging time period during which the voltage level of the gate of the output transistor decreases from the first voltage supply level down to approximately the threshold voltage level of the output transistor.

21 Claims, 26 Drawing Sheets

U.S. PATENT DOCUMENTS

| | | | |
|---|---|---|---|
| 4,588,941 | 5/1986 | Kerth et al. | 323/314 |
| 4,645,948 | 2/1987 | Morris et al. | 327/538 |
| 4,647,912 | 3/1987 | Bates et al. | 340/825.5 |
| 4,723,108 | 2/1988 | Murphy et al. | 323/315 |
| 4,751,404 | 6/1988 | Yuen | 307/297 |
| 4,760,292 | 7/1988 | Bach | 307/443 |
| 4,763,021 | 8/1988 | Stickel | 327/581 |
| 4,774,422 | 9/1988 | Donaldson et al. | 307/443 |
| 4,825,402 | 4/1989 | Jalali | 364/900 |
| 4,855,622 | 8/1989 | Johnson | 307/456 |
| 4,855,623 | 8/1989 | Flaherty | 326/87 |
| 4,894,561 | 1/1990 | Nogami | 326/27 |
| 4,922,140 | 5/1990 | Grahle et al. | 307/591 |
| 4,929,941 | 5/1990 | Lecocq | 340/825.14 |
| 4,972,106 | 11/1990 | Ruijs | 307/473 |
| 4,978,905 | 12/1990 | Hoff et al. | 327/427 |
| 4,980,579 | 12/1990 | McDonald et al. | 307/455 |
| 5,015,888 | 5/1991 | Ovens | 307/475 |
| 5,017,813 | 5/1991 | Galbraith et al. | 307/475 |
| 5,021,684 | 6/1991 | Ahuja et al. | 327/541 |
| 5,021,691 | 6/1991 | Saito | 307/451 |
| 5,023,487 | 6/1991 | Wellheuser et al. | 307/475 |
| 5,023,488 | 6/1991 | Gunning | 307/475 |
| 5,029,728 | 5/1991 | Sanwo et al. | 307/475 |
| 5,034,632 | 7/1991 | Jansson et al. | 307/456 |
| 5,041,743 | 8/1991 | Matsumoto | 307/455 |
| 5,070,256 | 12/1991 | Grondalski | 307/270 |
| 5,079,456 | 1/1992 | Kotowski et al. | 327/538 |
| 5,081,380 | 1/1992 | Chen | 307/591 |
| 5,095,231 | 3/1992 | Sartori et al. | 307/270 |
| 5,117,130 | 5/1992 | Shoji | 327/192 |
| 5,118,971 | 6/1992 | Schenck | 307/451 |
| 5,165,046 | 11/1992 | Hesson | 307/270 |
| 5,198,701 | 3/1993 | Davies et al. | 327/513 |
| 5,200,654 | 4/1993 | Archer | 327/362 |
| 5,208,492 | 5/1993 | Masumoto et al. | 326/87 |
| 5,216,292 | 6/1993 | Imazu et al. | 326/86 |
| 5,218,239 | 6/1993 | Boomer | 327/394 |
| 5,231,315 | 7/1993 | Thelen, Jr. | 327/103 |
| 5,241,221 | 8/1993 | Fletcher et al. | 307/443 |
| 5,254,883 | 10/1993 | Horowitz et al. | 307/443 |
| 5,285,116 | 2/1994 | Thaik | 327/170 |
| 5,291,071 | 3/1994 | Allen et al. | 307/270 |
| 5,293,082 | 3/1994 | Bathaee | 307/270 |
| 5,296,756 | 3/1994 | Patel et al. | 307/270 |
| 5,304,861 | 4/1994 | Fruhauf et al. | 327/514 |
| 5,313,118 | 5/1994 | Lundberg | 307/270 |
| 5,315,174 | 5/1994 | Chang et al. | 327/384 |
| 5,319,258 | 6/1994 | Ruetz | 327/108 |
| 5,329,184 | 7/1994 | Redfern | 307/270 |
| 5,334,882 | 8/1994 | Ting | 307/270 |
| 5,338,987 | 8/1994 | Tomasetti et al. | 307/270 |

OTHER PUBLICATIONS

*National Semiconductor Corporation, "DS36950 Quad Differential Bus Transceiver", Interface Databook, 1990 Edition, pp. 1–123 to 1–131.

*National Semiconductor Corporation, "DS3886 BTL 9–Bit Latching Data Transceiver", High Performance Bus Interface Designer's Guide, 1991 Edition, pp. 1–74 to 1–80.

*National Semiconductor Corporation, "DS3883 BTL 9–Bit Data Transceiver", High Performance Bus Interface Designer's Guide, 1991 Edition, pp. 1–58 to 1–62.

Allen, Phillip E., and Holberg, Douglas R., "CMOS Analog Circuit Design" (1987) Saunders College Publishing, a division of Holt, Rinehart and Winston, Inc., Section 5.5 "Current and Voltage References", pp. 240–251.

| $C_1$ | $C_2$ | $V_{GM70}$ | $V_{GM72}$ | $V_{GM74}$ | $V_{GM76}$ |
|---|---|---|---|---|---|
| 0 | 0 | 0 | 0 | 0 | 1 |
| 0 | 1 | 0 | 0 | 1 | 0 |
| 1 | 0 | 0 | 1 | 0 | 0 |
| 1 | 1 | 1 | 0 | 0 | 0 |

CMOS BUS AND TRANSMISSION LINE DRIVER HAVING PROGRAMMABLE EDGE RATE CONTROL

CROSS REFERENCE TO RELATED APPLICATION

This application is a continuation-in-part of U.S. Ser. No. 08/073,304, filed Jun. 8, 1993 now abandoned, and entitled "CMOS Bus and Transmission Line Driver Having Compensated Edge Rate Control".

BACKGROUND OF THE INVENTION

1. Field of the Invention

The present invention relates to line interface devices, and, in particular, to a CMOS transmission line driver that is used for interfacing CMOS digital circuits to transmission lines.

2. Description of the Related Art

Digital systems typically include several Very Large Scale Integrated (VLSI) circuits that cooperate and communicate with one-another to perform a desired task. FIG. 1 illustrates a typical digital system. The VLSI circuits are mounted on several circuit boards that are referred to as "daughter boards". Each daughter board may accommodate several VLSI circuits. In turn, the daughter boards are received by a "mother board" that has circuitry for facilitating communication between the individual daughter boards.

The individual VLSI circuits are interconnected for binary communication by transmission mediums. The transmission mediums are generally collected together to form buses. The number, size and types of buses that are used in a digital system may be designed for general-purpose applications or according to a more specific, industry standard data-communications configuration. One such industry standard is the so-called IEEE 896.1 Futurebus+ standard. The Futurebus+ standard provides a protocol for implementing an internal computer bus architecture.

FIG. 1 illustrates the hierarchy of the several different bus levels utilizable in a Futurebus+ system. A "component level bus" is used to interconnect the several VLSI circuits that are located on a single daughter board, and a "backplane bus" is used to interconnect the VLSI circuits of one daughter board to the VLSI circuits of another daughter board. Thus, a component level bus is constructed on each daughter board, and a backplane bus is constructed on the mother board.

The transmission mediums which form the component and backplane buses are typically traces which are formed on the printed circuit board (PCB) substrates of the daughter and mother boards. Microstrip traces and strip line traces can be employed to form transmission lines having characteristic impedances on the order of about 50Ω–70Ω. Such transmission lines usually have their opposite ends terminated in their characteristic impedance. Because of the parallel resistive terminations, the effective resistance of the transmission line may be as low as 25Ω–35Ω.

Data transceivers (TRANSmitter/reCEIVER) are used to interface the VLSI circuits to the transmission medium. FIG. 2 illustrates the positioning of a data transceiver between the backplane bus of a Futurebus+ system and the data bus of a VLSI circuit to facilitate communications between the VLSI circuit and the rest of the digital system.

A data transceiver is a read/write terminal capable of transmitting information to and receiving information from the transmission medium. A transceiver typically includes a line driver stage (or simply "driver") and a receiver stage (or simply "receiver"). The common purpose of transmission line drivers and receivers is to transmit data quickly and reliably through a variety of environments over electrically long distances. This task is complicated by the fact that externally introduced noise and ground shifts can severely degrade the data.

Drivers amplify digital signal outputs from the VLSI circuitry so that the signals can be properly transmitted on the transmission medium. Receivers are typically differential amplifiers that receive signals from the transmission medium and provide outputs to the VLSI circuitry that are representative of digital information received from the medium.

Conventional drivers usually include level shifting capability to provide compatibility with different integrated circuit technologies. Specifically, before a driver transmits a signal across a transmission medium, the driver changes the nominal voltage swing (or the "dynamic signal range") utilized by the VLSI circuitry, e.g., CMOS, TTL, ECL, etc., to a different voltage swing that is utilized by the transmission medium. Thus, a driver not only amplifies a digital signal, but it changes the nominal voltage swing of the signal as well.

CMOS technology is attractive for implementing VLSI circuits with high density and with much lower power dissipation than its bipolar counterpart. However, standard TTL or CMOS circuits operate between 5 Volts and ground which causes them to dissipate excessive amounts of power when driving terminated transmission lines. ECL has been used for many years to drive terminated transmission lines; however, ECL has relatively high power dissipation.

A different nominal voltage swing is normally used when transmitting data across a transmission medium in order to conserve power. Specifically, the power internally dissipated by the driver is proportional to the nominal voltage swing of the binary signal it applies to the transmission line. Therefore, power dissipation is reduced if the driver transmits a signal having a relatively small voltage swing over the transmission line.

It has become common for signals to be transmitted over transmission lines at BTL (Backplane Transceiver Logic) signal levels. The signal level standard is denoted "Backplane" because BTL has been used primarily in the backplane buses of mother boards. Because the nominal voltage swing of BTL is 1.0 Volt (logic low) to 2.1 Volts (logic high), power dissipation is less than it would be if the signals were transmitted over the transmission lines at CMOS (0 Volts to 3.3 Volts, or, 0 Volts to 5 Volts) or TTL (0 volts to 3.5 Volts) signal levels.

Signals have also been transmitted over transmission lines at the so-called "GTL" signal levels disclosed in U.S. Pat. No. 5,023,488 to Gunning ("Gunning"). Gunning discloses such GTL drivers and receivers for interfacing VLSI CMOS circuits to transmission lines. The nominal voltage swing of GTL is 0.3 Volts (logic low) to 1.2 Volts (logic high).

FIG. 3 shows the basic GTL driver 10 that is disclosed in Gunning. A very wide channel, open drain, N-channel CMOS transistor M1 is used for transferring binary signals to a transmission line 12 from a more or less conventional CMOS signal source 14 which effectively isolates the transmission line 12 from the ordinary 5 v rail-to-rail signal swing of the signal source 14. Transistor M1 has its gate connected to the output of the signal source 14, its drain connected to the transmission line 12, and its source returned to ground (i.e., the same reference level as the 0 v rail of the signal source 14).

The rate at which the transistor M1 responds to transitions in the binary signal supplied by the signal source 14 is dependent upon the rate at which transistor M1's gate capacitance charges and discharges. Therefore, for higher frequency operations, the output stage of the signal source 14 is an inverter comprising a p-channel transistor M2 and an n-channel transistor M3. Transistors M2 and M3 are connected in a standard inverter configuration. More particularly, they have their gates connected to a signal node $V_{IN}$ within the signal source 14, their drains connected to the gate of the transistor M1, and their sources connected to the 5 v rail and the 0 v rail, respectively, of signal source 14.

In operation, when the signal at $V_{IN}$ drops to a low ("0") logic level, transistors M2 and M3 are switched into and out of conduction, respectively. Thus, the gate capacitance of transistor M1 is charged relatively rapidly by the current conducted by the source-drain circuit of transistor M2. The gate of transistor M1 is quickly pulled up toward the 5 Volt rail of the signal source 14, thereby causing transistor M1 to promptly switch into conduction. On the other hand, when the signal $V_{IN}$ increases to a high ("1") logic level, transistor M2 switches out of conduction while transistor M3 switches into conduction. This causes the gate capacitance of transistor M1 to be quickly discharged by the current conducted by the source-drain circuit of transistor M3 so that the gate of transistor M1 is pulled down relatively rapidly toward the 0 Volt rail of the signal source 14, thereby promptly switching transistor M1 out of conduction.

The signal level on the transmission line 12 tends to stabilize substantially at the voltage level to which the transmission line 12 is terminated a short time after transistor M1 is switched out of conduction (i.e., as soon as the switching transients have settled out). On the other hand, when transistor M1 is switched into conduction, its source-drain circuit provides a ground return path for current flow through the terminating resistors 16 and 18. The signal level at which the transmission line 12 tends to stabilize (again, after the switching transients have settled out) is determined by the voltage division which the parallel terminating resistor 16 and 18 and the source-drain resistance of the conductive transistor M1 perform on the voltage to which the transmission line 12 is terminated.

The effective voltage dividing ratio of the divider is determined to a first approximation by the ratio of the source-drain resistance of transistor M1 in its conductive state to the sum of that resistance plus the effective resistance of the parallel terminating resistors 16 and 18. Thus, for example, if the low ("0") signal level on the transmission line 12 is selected to be approximately 0.3 Volts to provide a signal swing of approximately 1.0 Volts, the channel width of the transistor M1 ordinarily has to be orders of magnitude greater than its channel length to reduce the effective resistance of its source-drain circuit in conduction to a suitably low level. The optimal channel width-to-channel length ratio of transistor M1 depends on several process and application specific variables, but a ratio of about 1000:1 is typical at the current state of the art.

FIG. 4 shows a GTL driver 20 with a damping circuit. Specifically, provision is made in the driver 20 for damping certain of the switching transients which are generated when transistor M1 is switched into and out of conduction. These improvements permit the GTL signal swing to be reduced to a swing of about 0.8 Volts between an upper limit of approximately 1.2 Volts and a lower limit of about 0.4 Volts.

Some of the more troublesome switching transients occur when transistor M1 is switched from a conductive state to a non-conductive state. The drain-side parasitic packaging inductance and the drain-side parasitic capacitances of transistor M1 form a ringing circuit which tends to cause the voltage on the transmission line 12 to overshoot its nominal upper limit by a substantial margin and to oscillate for a prolonged period of time. Similarly, the source-side parasitic inductances and capacitances of transistor M1 form another ringing circuit which tends to cause a potentially troublesome oscillatory "ground bounce" perturbance of the reference voltage on the low level rail of the CMOS circuit.

To reduce these switching transients, the driver 20 is equipped with a feedback circuit for briefly connecting the drain of transistor M1 to its gate when transistor M1 is switched from a conductive state to a non-conductive state. The feedback circuit includes a pair of n-channel transistors M4 and M5 which have their source-drain circuits connected in series between the drain and gate of transistor Mi. The input $V_{IN}$ for the driver 20 is coupled to the gate of transistor M5, and two additional inverter stages 22 and 24 are coupled between the inverter 14 and the gate of transistor M4.

During operation, a low ("0") logic level signal at $V_{IN}$ holds transistor M5 in a non-conductive state and transistors M1 and M4 in conductive states. However, shortly after the logic level of the signal at $V_{IN}$ increases to a high ("1") logic level, the p-channel transistor M2 and the n-channel transistor M3 of the asymmetric inverter stage 14 switch out of and into conduction, respectively. Transistor M3 tends to pull the gate of transistor M1 down toward ground, but transistor M5 is now switched into conduction, so it completes a feedback path between the drain and the gate of transistor M1. Transistor M3 is relatively weak (i.e., it has a significantly higher source-drain resistance than the other transistors), so most of the discharge current for the gate capacitance of transistor M1 is drawn through the drain-source circuit of transistor M1 via transistors M4 and M5.

As the gate voltage of transistor M1 drops, its drain voltage increase. However, the feedback path provided by the transistors M4 and M5 precludes the drain voltage of transistor M1 from increasing to a level significantly above its gate voltage. This limits the rate at which the current flowing through the parasitic inductances changes, thereby limiting the rates at which the drain-side capacitances, the source-side capacitances, and the gate-substrate capacitance discharge. Accordingly, the drain-side voltage overshoot and the source-side ground bounce are damped. Finally, about one nanosecond after transistor M5 is switched into conduction, the output of the last inverter stage 24 drops to a low ("0") logic level, so the feedback loop then is re-opened to permit the transistor M1 to switch completely out of conduction.

The GTL driver 20 disclosed in Gunning suffers from a number of disadvantages. First, the feedback circuit that is used to control the rising edge of $V_{out}$ prevents the drain voltage of transistor M1 from increasing to a level significantly above its gate voltage. Because the drain voltage is held low, $V_{OUT}$ cannot go high until the feedback circuit is disabled which increases the propagation delay of the driver 20.

A second disadvantage of the driver 20 is that its rise time $t_r$, fall time $t_f$, edge rate, turn-on delay, turn-off delay, and propagation delay are sensitive to temperature variations, supply voltage variations, and process variations.

A third disadvantage of the driver 20 is that its minimum rise time $t_r$ and fall time $t_f$ are too fast which causes ground bouncing, output over-shooting, and large cross-talk.

These disadvantages cause output pulse distortion.

Thus, there is a need for a transmission line driver that provides an output voltage swing of approximately 0.3 Volts (logic low) to 1.2 Volts (logic high) and that overcomes the disadvantages of the GTL drivers discussed above.

SUMMARY OF THE INVENTION

The present invention provides a driver for providing binary signals from a data system to a transmission line. The driver includes an output transistor having its drain-source circuit connectable between the transmission line and ground. The channel of the output transistor has a width that is greater than its length. An input stage provides a first charging current to the gate of the output transistor for a first charging time period during which the voltage level of the gate of the output transistor increases from ground level to a first voltage supply level. The input stage also provides a first discharging current for discharging the gate of the output transistor for a first discharging time period during which the voltage of the gate of the output transistor decreases from the first voltage supply level down to ground level. A first falling edge speed-up circuit provides a second charging current to the gate of the output transistor for a second charging time period beginning when the first charging time period begins and ending when the voltage level of the gate of the output transistor increases to approximately its threshold voltage level.

In another embodiment, the present invention provides a driver for providing binary signals from a data system to a transmission line having an output transistor and an input stage as described above and further having a gate charging speed-up circuit. The gate charging speed-up circuit provides a third charging current to the gate of the output transistor for a third charging time period beginning when the voltage level of the drain of the output transistor decreases to a low logic level and ending when the voltage level of the gate of the output transistor increases to approximately the first voltage supply level.

In another embodiment, the present invention provides a driver for providing binary signals from a data system to a transmission line having an output transistor and an input stage as described above and further having a rising edge discharge circuit. The rising edge discharge circuit provides a second discharging current for discharging the gate of the output transistor for a second discharging time period during which the voltage level of the gate of the output transistor decreases from the first voltage supply level down to approximately the threshold voltage level of the output transistor.

The present invention also provides a method of charging the gate of an output transistor of a driver which provides binary signals from a data system to a transmission line. The method includes the steps of providing a first charging current to the gate of the output transistor for a first charging time period during which the voltage level of the gate of the output transistor increases from ground level to a first voltage supply level. A second charging current is provided to the gate of the output transistor for a second charging time period beginning when the first charging time period begins and ending when the voltage level of the gate of the output transistor increases to approximately its threshold voltage level. A third charging current is provided to the gate of the output transistor for a third charging time period beginning when the voltage level of the drain of the output transistor decreases to a low logic level and ending when the voltage level of the gate of the output transistor increases to approximately the first voltage supply level.

The present invention also provides a method of discharging the gate of an output transistor of a driver which provides binary signals from a data system to a transmission line. The method includes the steps of providing a first discharging current for discharging the gate of the output transistor for a first discharging time period during which the voltage of the gate of the output transistor decreases from a first voltage supply level down to ground level. A second discharging current is provided for discharging the gate of the output transistor for a second discharging time period during which the voltage level of the gate of the output transistor decreases from the first voltage supply level down to approximately the threshold voltage level of the output transistor.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE PREFERRED EMBODIMENT

Figure 5:
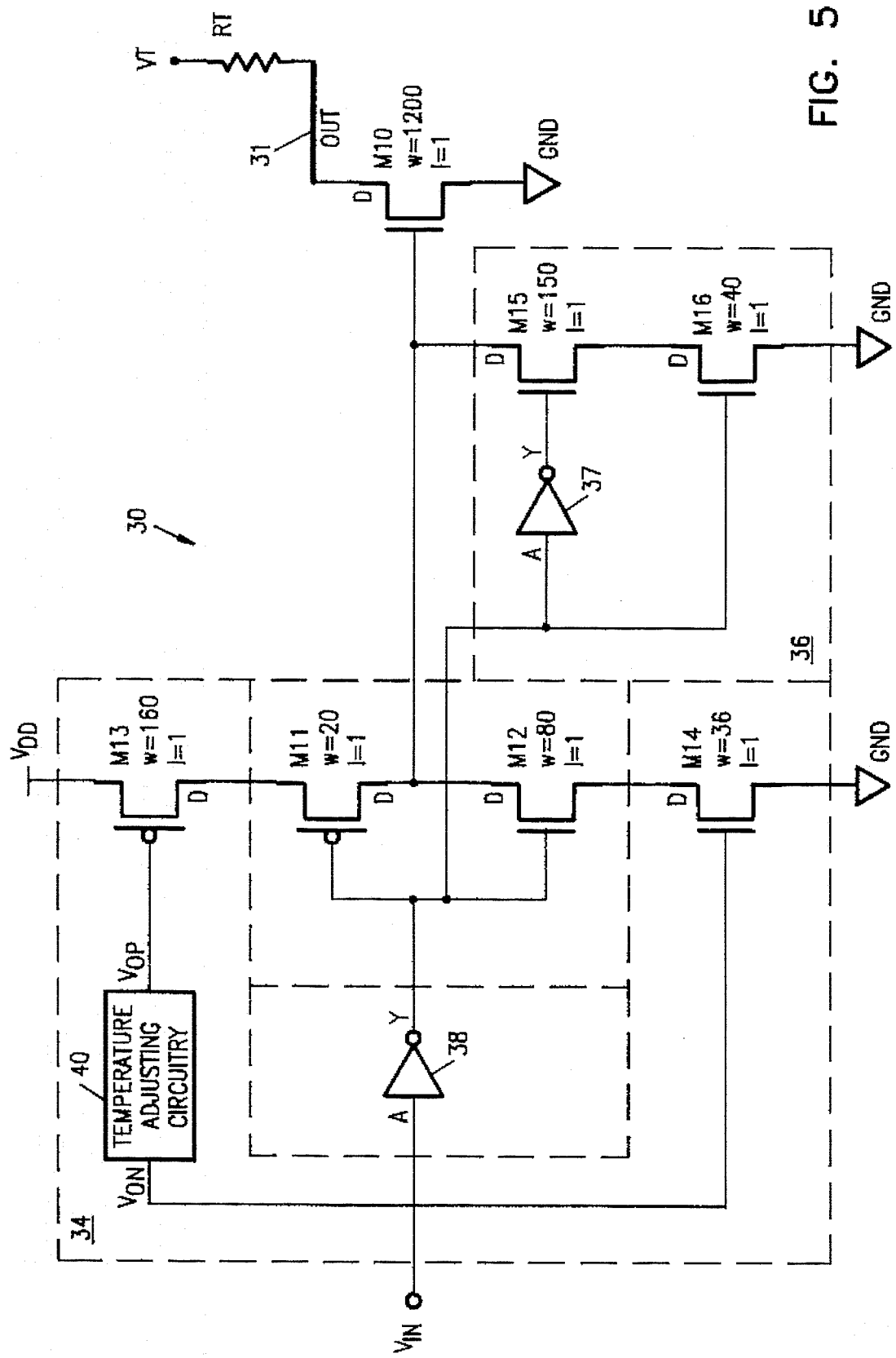
FIG. 5 is a schematic diagram illustrating a CMOS transmission line driver in accordance with the invention described in the parent application cross-referenced above.

FIG. 5 shows a CMOS transmission line driver 30 in accordance with the invention described in the related parent application which is cross-referenced above. The driver 30 has an output voltage swing of approximately 0.3 Volts (logic low) to 1.2 Volts (logic high). Thus, the output of the driver 30 is compatible with the so-called "GTL" standard discussed above. The driver 30's logic low output may be equal to 0.3 Volts ±0.1 Volt and its logic high output may be equal to 1.2 Volts ±5% when supply voltage variations are taken into account.

The driver 30 is a high speed bus driver with unique edge rate control. It has low output pulse distortion and may be operated at a data rate up to 250 MHz. It is capable of carrying out binary communications over a relatively low impedance transmission line 31 which is terminated to voltage levels $V_T$ on the order of about 1.2 Volts. The transmission line 31 is typically a microstrip trace or a strip line trace with a characteristic impedance on the order of about 50Ω–70Ω. Normally, the transmission line 31 has its opposite ends terminated in its characteristic impedance. A resistor $R_T$ symbolizes the effective resistance of the parallel terminating resistors; thus, resistor $R_T$ has a value of approximately 25Ω–35Ω.

The driver 30 includes a very wide channel, open drain, n-channel MOSFET M10. The drain of the transistor M10 is coupled to the transmission line 31 and the source is coupled to ground. The channel width of transistor M10 should be orders of magnitude greater than its channel length to reduce the effective resistance of its drain-source circuit during conduction. Preferably, transistor M10 has a channel width of 1200 µm and a length of 1 µm. Furthermore, although only a single transistor M10 is shown, it is to be understood that it may be fabricated by connecting any number of n-channel transistors in parallel with each other; such parallelism may be used for producing a transistor M10 of the desired effective channel width.

The gate of transistor M10 is coupled to an inverter stage 32. The purpose of the inverter stage 32 is to conduct current from a voltage supply $V_{DD}$ to the gate of transistor M10 in order to switch it into a conductive state and to conduct current from the gate of the transistor M10 to ground in order to switch it into a non-conductive state. The inverter stage 32 includes a p-channel transistor M11 that has its drain coupled to the drain of an n-channel transistor M12. The gates of transistors M11 and M12 are coupled together and form the input of the inverter stage 32.

The input of the inverter stage 32 and the gate of transistor M10 are coupled to a discharge circuit 36. The purpose of the discharge circuit 36 is to provide a discharge path from the gate of transistor M10 to ground during a discharge time period and then remove the discharge path at the end of the discharge time period. The discharge time period begins when the inverter stage 32 receives a binary signal commanding it to switch transistor M10 from the conductive state to the non-conductive state. The discharge time period has a length equal to a period of time necessary to decrease the gate-source voltage $V_{GS}$ of transistor M10 from approximately the $V_{DD}$ level down to a level just above transistor M10's threshold voltage $V_{TH}$. It has been found herein that a discharge time period equal to one logic gate delay time, specifically, a CMOS inverter delay time, gives good results. As will be discussed in more detail below, the discharge circuit 36 prevents the problems of output voltage overshoot and ground bouncing without increasing the turn-off delay of the circuit.

The discharge circuit 36 includes two n-channel transistors M15 and M16 that have their drain-source circuits connected in series between the gate of transistor M10 and ground to provide a discharge path directly from the gate of transistor M10 to ground. Transistors M15 and M16 are switched into simultaneous conducting states for approximately one logic gate delay time by means of their gate connections and an inverter 37. Specifically, the gate of transistor M15 is coupled to the output of inverter 37, and the input of inverter 37 is coupled to the input of the inverter stage 32. The gate of transistor M16 is coupled to the input of the inverter stage 32. The operation of transistors M15 and M16 will be described in greater detail below.

A temperature compensation circuit 34 is coupled to the inverter stage 32. The purpose of the temperature compensation circuit 34 is to adjust the level of current conducted to the gate of transistor M10 and the level of current conducted from the gate of transistor M10 to compensate for variations in temperature. As will be described in detail below, the temperature compensation circuit 34 causes the driver 30's rise time $t_r$, fall time $t_f$, edge rate, turn-on delay, turn-off delay, and propagation delay to be relatively insensitive to temperature variations, supply voltage VDD variations, and process variations.

The temperature compensation circuit 34 includes a p-channel transistor M13 that has its source coupled to $V_{DD}$ and its drain coupled to the source of transistor M11. An n-channel transistor M14 has its source coupled to ground and its drain coupled to the source of transistor M12. The gates of transistors M13 and M14 are coupled to outputs $V_{OP}$ and $V_{ON}$, respectively, of adjusting circuitry 40. The effects of temperature variation on MOSFET transistors, as well as the structure and operation of the temperature compensation circuit 34, will be described in detail below with reference to FIGS. 6 and 7. For the present discussion regarding the basic operation of the driver 30, however, it can be assumed that outputs $V_{OP}$ and $V_{ON}$ maintain a sourcegate potential $V_{SG}$ and gate-source potential $V_{GS}$ on transistors M13 and M14 such that they will conduct current whenever transistors M11 and M12 are conducting current, respectively. It should also be noted that transistors M13 and M14 may be positioned between transistors M11 and M12.

In other words, the source of transistor M11 may be connected directly to voltage $V_{DD}$ and the source of transistor M13 connected to the drain of transistor M11, and the source of transistor M12 may be connected directly to ground and the source of transistor M14 connected to the drain of transistor M12.

A CMOS inverter 38 is preferably inserted between input VIN and the input of the inverter stage 32. The inverter 38 causes the driver 30 to invert binary signals from input to output. However, the inverter 38 is used primarily as a buffer and its use is optional in the present invention.

In order to describe the operation of the driver 30, it will be assumed that the input $V_{IN}$ initially receives a high or logic "1" level CMOS signal, i.e., $V_{IN}$=3.3 Volts. The output of inverter 38 is low which pulls down the gate of transistor M11 so that both it and transistor M13 conduct current from source to drain. Current is conducted to the gate of transistor M10 so that the gate of transistor M10 is pulled up to≈$V_{DD}$ causing transistor M10 to be in a conducting state. Because transistor M10 conducts current from drain to source, current flows through the terminating resistor $R_T$. A voltage drop is created across the resistor $R_T$ causing the potential of the transmission line 31, i.e., $V_{OUT}$, to be pulled to a GTL low level, i.e., approximately 0.3 Volts ±0.1 Volts.

While transistor M10 is conducting current, the gate of transistor M15 is pulled high because the output of inverter 37 is at a high level. Transistor M15, however, does not conduct current at this point because the gate of transistor M16 is held low by the low output of inverter 38. Furthermore, the gate of transistor M12 is held low so that it and transistor M14 do not conduct current.

When input $V_{IN}$ is switched to a low or logic "0" level CMOS signal, i.e., $V_{IN}$=0 Volts, the output of inverter 38 pulls the gate of transistor M16 high which causes it to conduct current from drain to source. The gate of transistor M15 remains pulled high for approximately one logic gate delay due to the presence of inverter 37. Thus, an instant peak current is produced through transistors M15 and M16 to pull the gate of transistor M10 down quickly from VDD level. After one logic gate delay, the output of inverter 37 goes low causing transistor M15 to stop conducting current. Thus, transistor M16 provides instant discharge current from the gate of transistor M10 until transistor M15 switches off one logic gate delay later. It should be noted that three or five logic gate delays will also provide a sufficient discharge time period.

Meanwhile, the gates of transistors M11 and M12 are pulled high which causes transistors M11 and M13 to stop conducting and transistors M12 and M14 to start conducting. Transistors M12 and M14 provide a constant discharging path from the gate of transistor M10 to ground. The gate of transistor M10 discharges at a rate of:

$$dV_{GSM10}/dt = I_{DSM14}/C_{gM10}$$

where $C_{gM10}$ is the total capacitance at the gate of transistor M10 and $I_{DSM14}$ is the current through transistors M12 and M14. Because the gate of transistor M10 is being pulled down to ground, the drain of transistor M10 is linearly rising to the $V_T$ voltage level, i.e., the GTL high level.

When input $V_{IN}$ is switched back to a high or logic "1" level CMOS signal, i.e., VIN=3.3 Volts, the gate of transistor M16 is pulled low and the gate of transistor M15 is pulled high one logic gate delay thereafter. Transistors M15 and M16 do not conduct current because the gate of transistor M16 is held low. Furthermore, the gates of transistors M11 and M12 are pulled low which causes transistors M11 and M13 to start conducting current and transistors M12 and M14 to stop conducting current. Transistor M13 sources a constant current through transistor M11 to charge up the gate of transistor M10 at a rate of:

$$dV_{GSM10}/dt = I_{SDM13}/C_{gM10}$$

where $I_{SDM13}$ is the current conducted by transistors M13 and M11. As soon as the gate-source voltage VGS of transistor M10 reaches its threshold voltage level $V_{TH}$, the drain voltage of transistor M10, i.e., $V_{OUT}$, starts ramping down linearly.

The driver 30 of the present invention has several advantages over the driver 20 discussed above. First, the discharge circuit 36 reduces output over-shoot and ground bounce (when transistor M10 is switched from a conductive state to a non-conductive state) without increasing the driver 30's propagation delay. Propagation delay is not increased because the voltage level of the drain of transistor M10 is not prevented from rising as is the case with the driver 20. Thus, the fast discharge path provided by transistors M15 and M16 causes the driver 30 to have a fast propagation delay. Furthermore, the temperature compensation circuit 34 controls the current conducted to the gate of transistor M10 to reduce the minimum rise time $t_r$ and fall time $t_f$ of the driver 30 from causing ground bouncing, output over-shooting, and large cross-talk.

A second advantage of the driver 30 is that the temperature compensation circuit 34 causes the driver's rise time $t_r$, fall time $t_f$, edge rate, turn-on delay, turn-off delay, and propagation delay to be relatively insensitive to temperature variations, supply voltage variations, and process variations.

In the embodiment shown in FIG. 5, transistor M11 has a channel width=20 µm and a channel length =1 µm, transistor M12 has a channel width=80 µm and a channel length=1 µm, transistor M13 has a channel width=160 µm and a channel length=1 µm, transistor M14 has a channel width=36 µm and a channel length=1 µm, transistor M15 has a channel width= 150 µm and a channel length=1 µm, and transistor M16 has a channel width=40 µm and a channel length=1 µm. It should be understood, however, that these channel sizes may be varied to suit the needs of a particular application.

Figure 1:
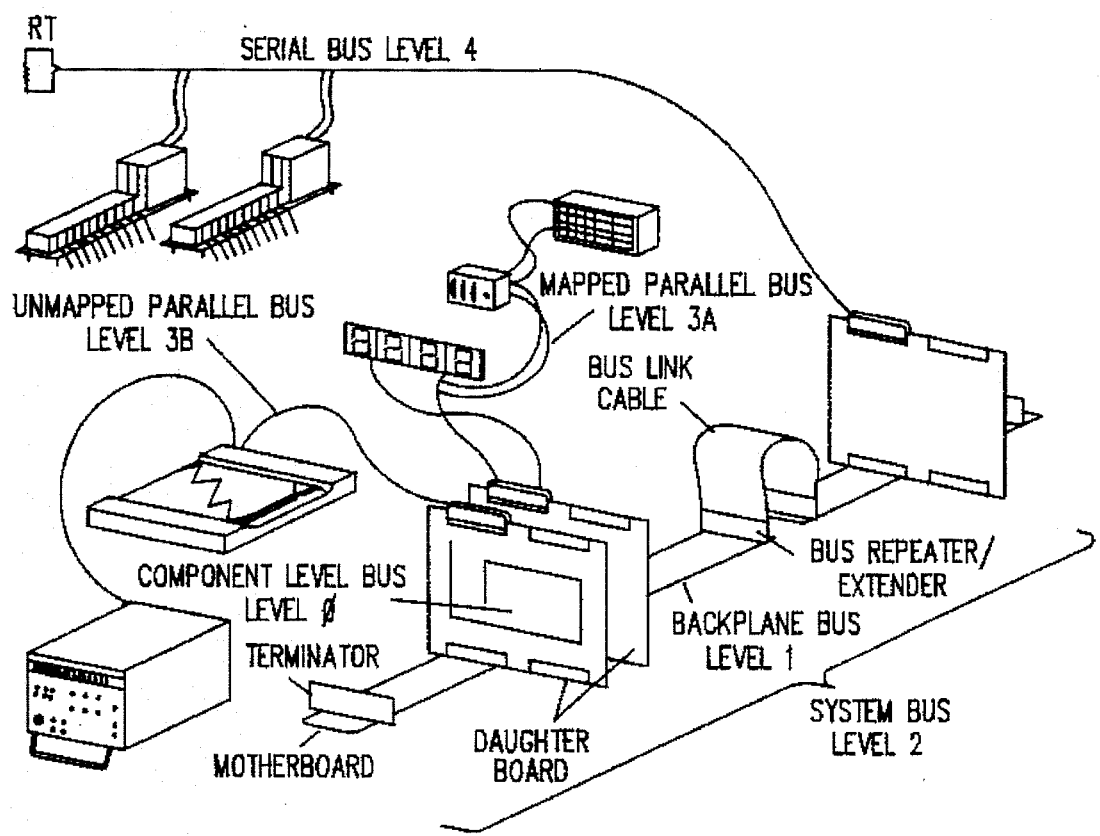
FIG. 1 is a pictorial illustration of the hierarchy of bus levels in a Futurebus+ system.
Figure 2:
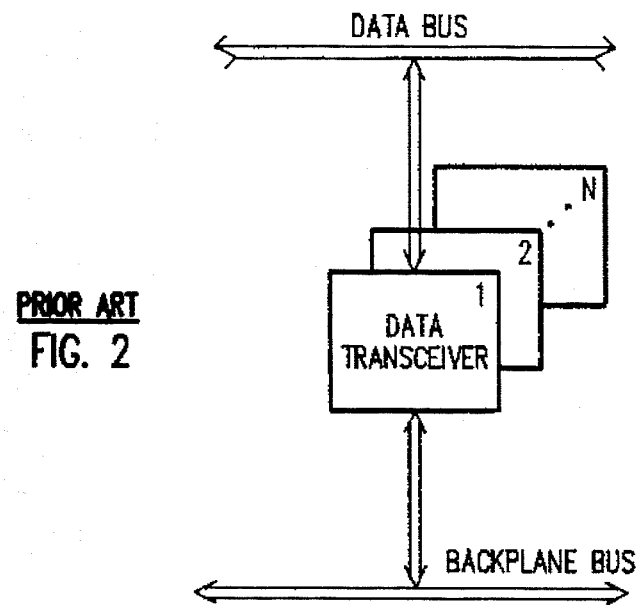
FIG. 2 is a block diagram illustrating the placement of a data transceiver between the backplane bus of a Futurebus+ system and the data bus of a processor in the Futurebus+ system.
Figure 3:
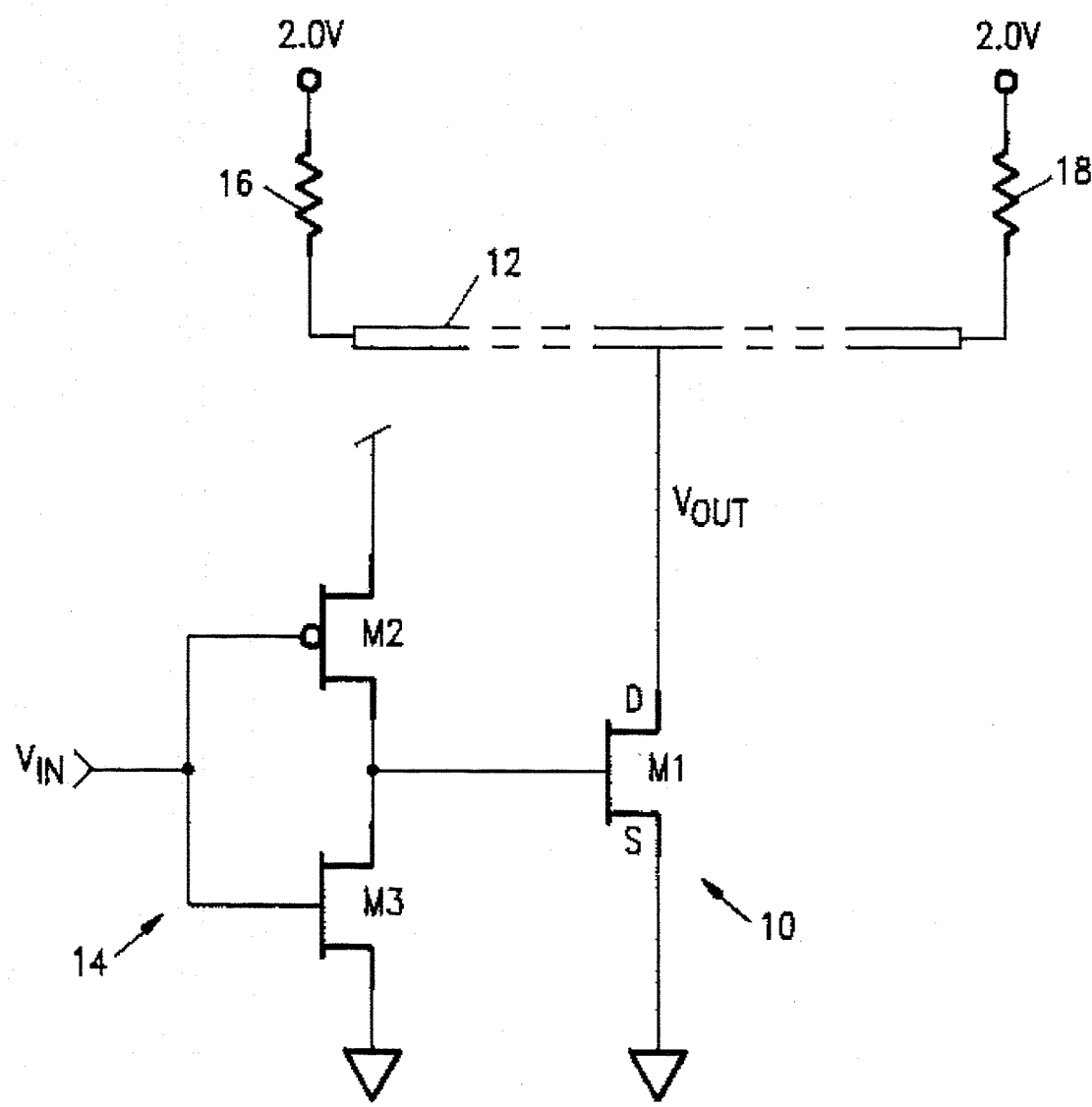
FIG. 3 is a schematic diagram illustrating a prior art GTL transmission line driver.
Figure 4:
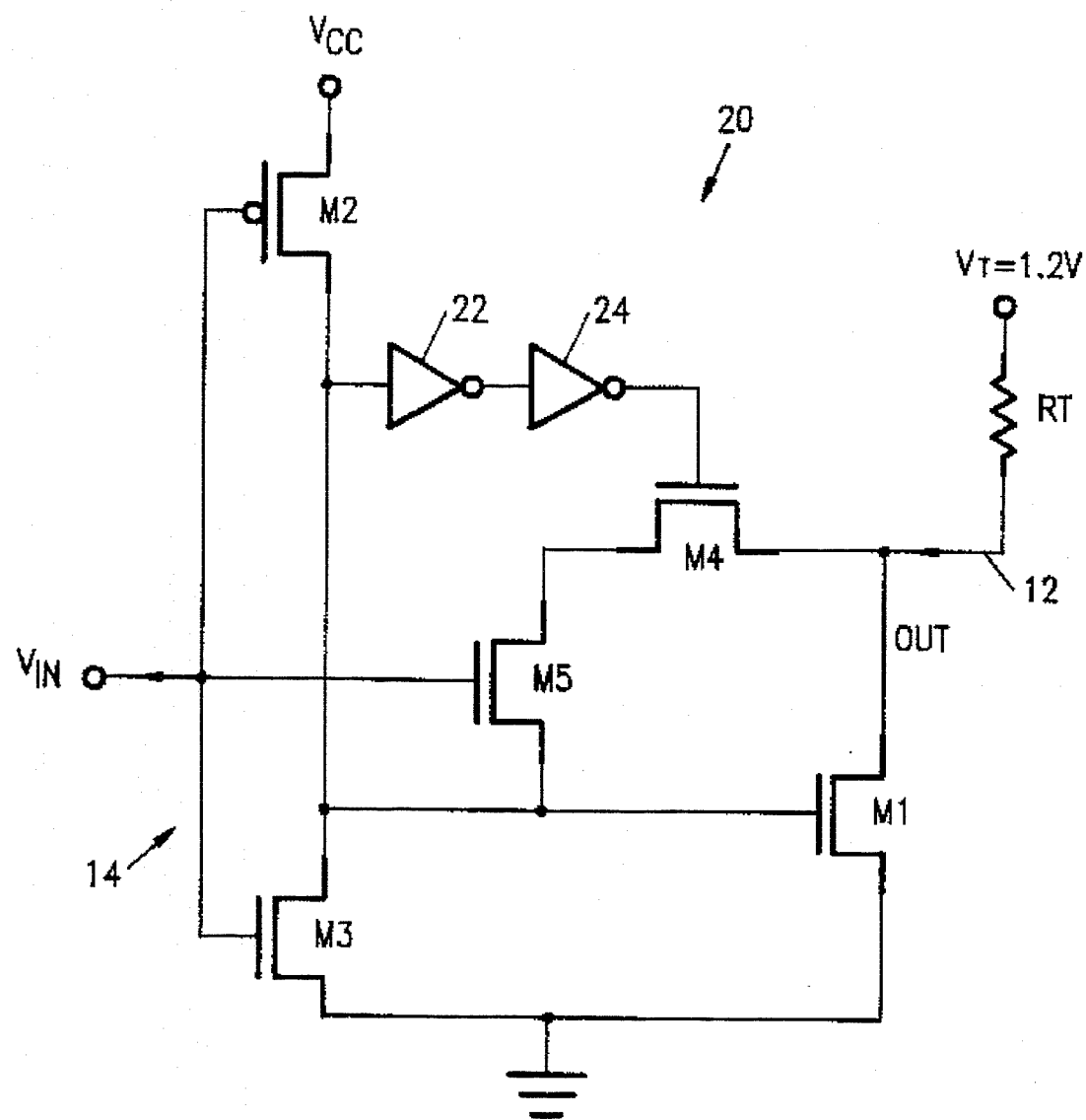
FIG. 4 is a schematic diagram illustrating the prior art GTL transmission line driver shown in FIG. 3 with a damping circuit.

The temperature compensation circuit 34, which includes the temperature adjusting circuitry 40 and the current source transistors M13 and M14, provides a means for adjusting the source-drain current $I_{SD}$ through transistor M11 and the drain-source current $I_{DS}$ through transistor M12 to compensate for temperature variations. Use of the temperature compensation circuit 34 with the driver 30 prevents the problematic variations in rise-time $t_r$ and fall time $t_f$ due to variations in temperature that plague the driver 20 shown in FIG. 4.

Temperature variations affect the performance of FETs. Temperature variations may be in the form of ambient temperature variations, i.e., variations in the temperature of the air surrounding integrated circuits, and/or junction temperature variations, i.e., variations in the temperature of the silicon in an integrated circuit. Ambient temperature variations can cause junction temperature variations, and vice versa.

FET performance is affected because temperature variations tend to cause the transconductance $g_m$ of the transistors to vary. The amount of current that is conducted by a transistor's current conducting channel, i.e., the current conducted between the drain and source ($I_{DS}$ for n-channel and $I_{SD}$ for p-channel), is determined in part by $g_m$. In the case of a MOSFET, when temperature increases, transconductance $g_m$ decreases which causes currents $I_{DS}$ and $I_{SD}$ to decrease. On the other hand, when temperature decreases, transconductance $g_m$ increases which causes $I_{DS}$ and $I_{SD}$ to increase. Thus, it may be said that the current conducted by the channel of a MOSFET has a negative temperature coefficient. Furthermore, $I_{DS}$, $I_{SD}$, and $g_m$ vary linearly with temperature variations.

Logic gates, such as the driver 30, are typically constructed from several transistors. The speed of a logic gate is determined in part by the $I_{DS}$ of the individual transistors, which results in gate speed being proportional to $g_m$. If the $g_m$ of each transistor in a logic gate varies with temperature, then the $I_{DS}$ of each transistor also varies which causes the speed of the logic gate to vary with temperature. For example, when temperature increases, gate speed decreases, and when temperature decreases, gate speed increases.

Variations in gate speed due to temperature variations is an undesirable characteristic because such variations can adversely affect the synchronized timing operations of a digital system. Digital systems can be designed to operate more efficiently if the designer can be assured that gate speed will remain constant. Gate speed can be kept relatively constant if temperature is kept constant. However, because digital systems must operate in a variety of environments, ambient and junction temperature cannot always be controlled. A relatively constant logic gate speed can be maintained during temperature variations if the current conducted by the conducting channels of a logic gate's MOSFET transistors is maintained at relatively constant levels despite the temperature variations.

Figure 6A:
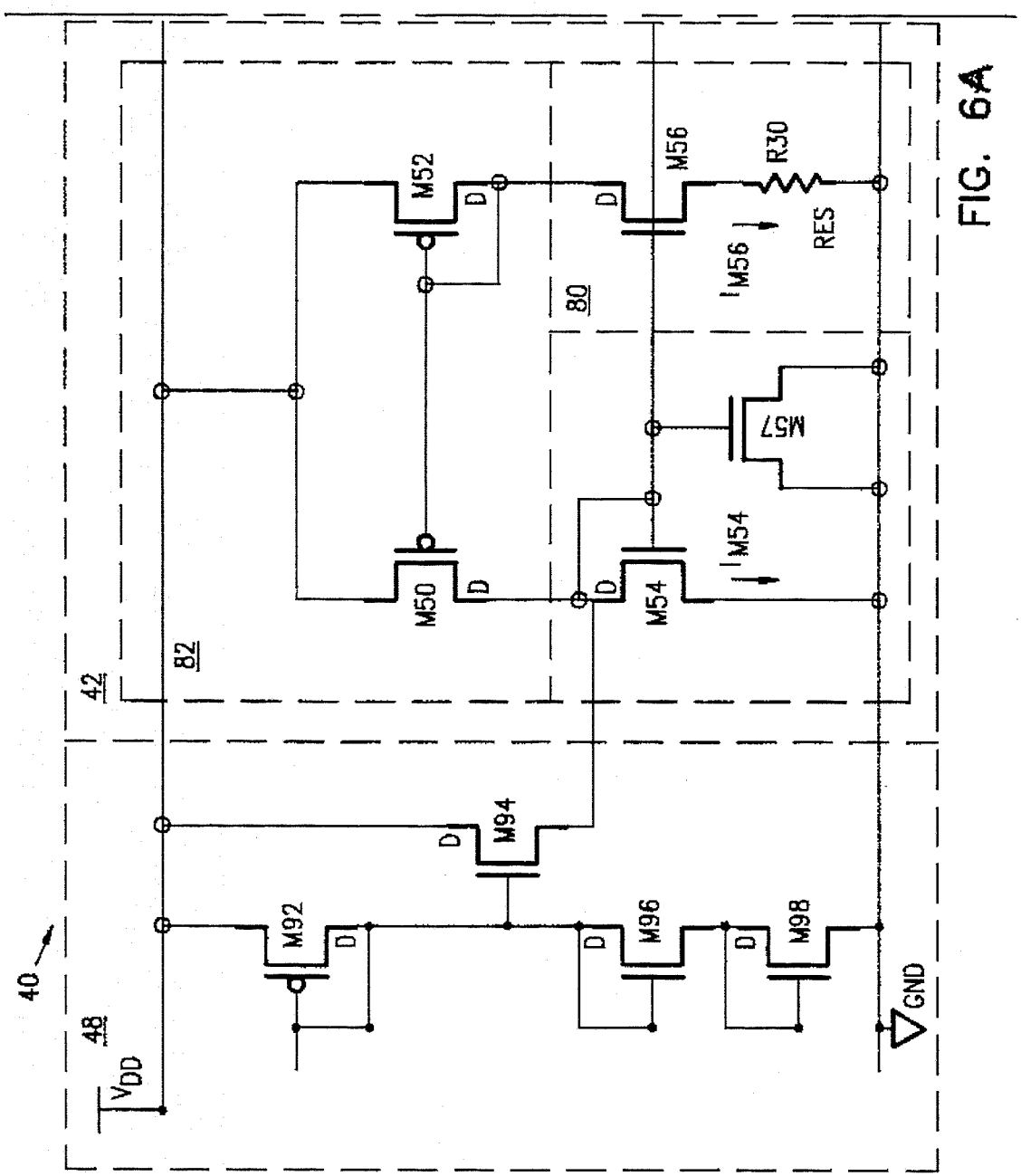
FIG. 6 is a schematic diagram illustrating a programmable CMOS temperature compensation circuit that may be used with the transmission line driver shown in FIG. 5.
Figure 6B:
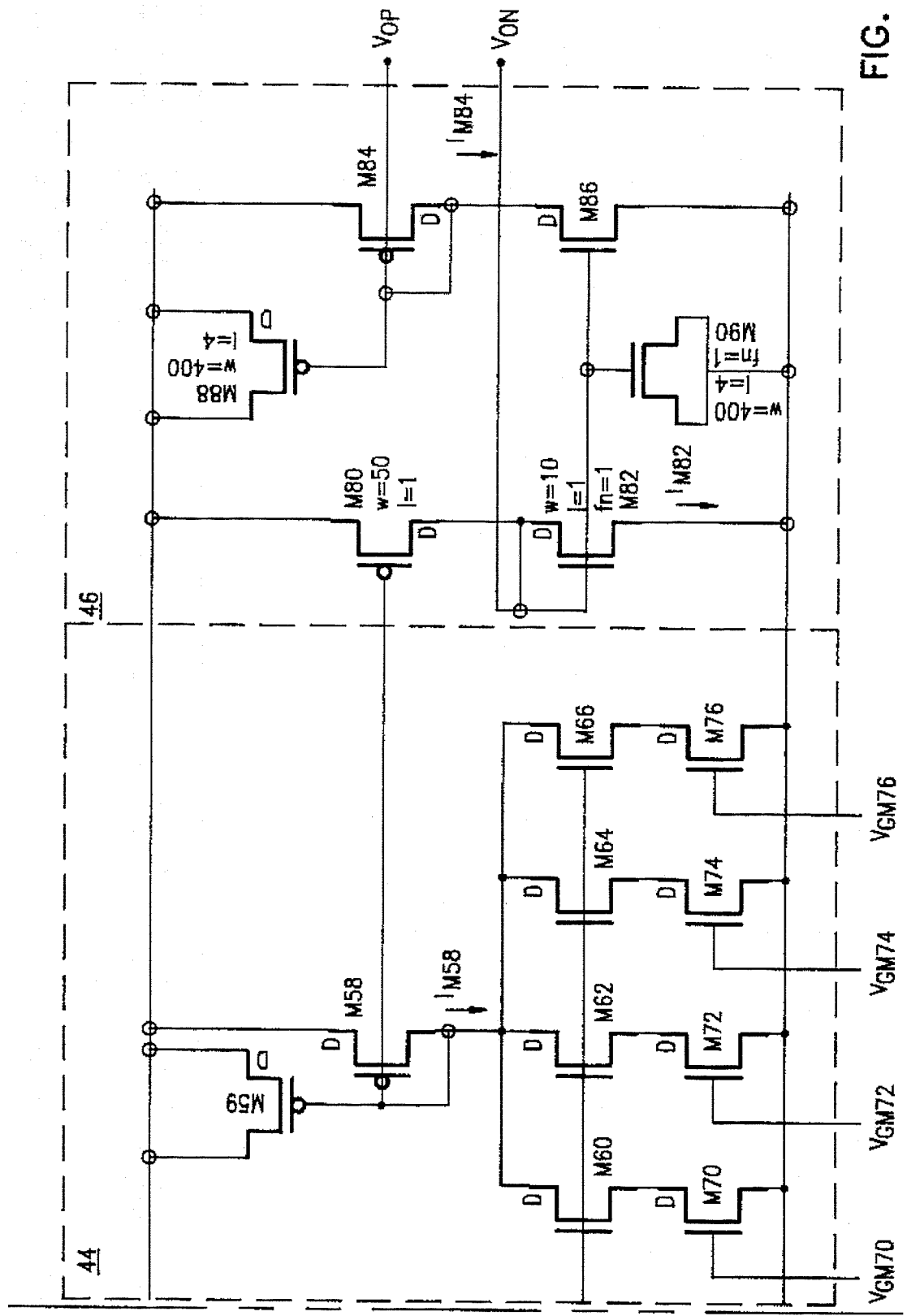

FIG. 6 shows the detailed structure of the programmable CMOS temperature adjusting circuitry 40. The circuit 40 is capable of adjusting the currents $I_{DS}$ and $I_{SD}$ generated by transistors M13 and M14, respectively, to compensate for temperature variations.

In general, the circuit 40 adjusts the $I_{SD}$ generated by transistor M13 to compensate for variations in temperature by adjusting transistor M13's gate voltage in response to the temperature variations. Because transistor M13 is a p-channel MOSFET, when temperature increases, the circuit 40 adjusts the gate voltage of the transistor, via output $V_{OP}$, so that the source-gate voltage $V_{SGM13}$ increases. By increasing $V_{SGM13}$, more current $I_{SD}$ will be conducted by the transistor M13's conducting channel which will compensate for the decrease in $I_{SD}$ due to the increase in temperature. On the hand, when temperature decreases, the circuit 40 adjusts the gate voltage of transistor M13 so that the source-gate voltage $V_{SGM13}$ decreases. By decreasing $V_{SGM13}$, less current $I_{SD}$ will be conducted by the transistor's conducting channel which will compensate for the increase in $I_{SD}$ due to the decrease in temperature.

The output $V_{ON}$ is for adjusting the gate voltage of the n-channel MOSFET M14 to compensate for temperature variations. When temperature increases, $V_{ON}$ increases $V_{GSM14}$ which causes more current $I_{DS}$ to be conducted by transistor M14's conducting channel. The increase in $I_{DS}$ compensates for the decrease in $I_{DS}$ due to the increase in temperature. On the other hand, when temperature decreases, $V_{ON}$ decreases $V_{GSM14}$ which causes less current $I_{DS}$ to be conducted by the transistor's conducting channel. The decrease in $I_{DS}$ compensates for the increase in $I_{DS}$ due to the decrease in temperature.

$V_{SGM13}$ and $V_{GSM14}$ may be adjusted (via $V_{OP}$ and $V_{ON}$, respectively) so that the currents $I_{SDM13}$ and $I_{DSM14}$ are maintained at relatively constant levels during temperature variations. Preferably, however, $V_{SDM13}$ and $V_{GSM14}$ are adjusted so that the currents $I_{SDM13}$ and $I_{DSM14}$ actually increase during temperature increases and decrease during temperature decreases. In the later scenario, $V_{SGM13}$ and $V_{GSM14}$ are simply increased or decreased slightly more than they would be in the first scenario. Increasing or decreasing the currents $I_{SDM13}$ and $I_{DSM14}$ according to the later scenario tends to compensate other transistors in the driver 30 that have no direct temperature compensation system, such as transistor M1. For example, increasing the currents $I_{SDM13}$ and $I_{DSM14}$ in response to a temperature increase will tend to increase the current conducted by the other uncompensated MOSFETs in the circuit.

The adjusting circuitry 40 includes a positive temperature coefficient current generation stage 42, a programmable current transfer and modification stage 44, an output stage 46, and a start-up stage 48.

The current generation stage 42 is an important component of the circuit 40 because it generates a drain-source current $I_{M54}$ in a MOSFET that has a positive temperature coefficient. In other words, when temperature increases, $I_{M54}$ increases, and when temperature decreases, $I_{M54}$ decreases. As discussed above, the current conducted by the channel of a MOSFET normally has a negative temperature coefficient. Because $I_{M54}$ has a positive temperature coefficient, the current transfer and modification stage 44 and the output stage 46 are able to use $I_{M54}$ to generate the outputs $V_{OP}$ and $V_{ON}$ which compensates for temperature variations.

The current generation stage 42 includes an n-channel transistor M54, a monitoring circuit 80, and a current generator 82. In general, the positive temperature coefficient current $I_{M54}$ is generated as follows: The current generator 82 generates and maintains two substantially equal currents $I_{M54}$ and $I_{M56}$ that are provided to the drain of transistor M54 and the monitoring circuit 80, respectively. When the strength of one of these currents changes, the current generator 82 changes the strength of the other current so that the two currents $I_{M54}$ and $IM_{56}$ remain substantially equal. The monitoring circuit 80 monitors the potential difference between the gate and source of transistor M54 and increases the strength of $I_{M56}$ in response to an increase in temperature, and decreases the strength of $IM56$ in response to a decrease in temperature. Whether $I_{M56}$ is increased or decreased by the monitoring circuit 80, the current generator 82 adjusts $I_{M54}$ so that the two currents remain substantially equal. Thus, $IM54$ increases when temperature increases and decreases when temperature decreases.

The monitoring circuit 80 includes an n-channel transistor M56 which has its gate coupled to the gate of transistor M54. A resistor R30 is coupled between a first node that is common with the source of transistor M54 and a second node that is common with the source of transistor M56. In the embodiment shown in FIG. 6, the first node is ground.

As indicated in FIG. 6, transistor M56 has a larger current conducting channel than the current conducting channel of transistor M54. Preferably, the channel of transistor M56 has a width of 160 µm (micro-meters) and a length of 2 µm, and the channel of transistor M54 has a width of 40 µm and a length of 2 µm. As will be discussed below, the smaller channel size of transistor M54 results in $V_{GSM54}$ being larger than $V_{GSM56}$ when the channels of transistors M54 and M56 conduct equal currents.

The current generator 82 includes two p-channel transistors M50 and M52 that have their gates coupled together. Transistor M50 has its drain coupled to the drain of transistor M54. Transistor M52 has its drain coupled to its gate and to the drain of transistor M56. The sources of transistors M50 and M52 are coupled to a common node so that the transistors function as a current mirror. In the embodiment shown in FIG. 6, the common node is a supply voltage $V_{DD}$.

As indicated in FIG. 6, transistors M50 and M52 have current conducting channels that are substantially the same size. Preferably, the channels of transistors M50 and M52 have widths of 80 μm and lengths of 2 μm. Furthermore, current $I_{M54}$ flows from the drain of transistor M50, and current $I_{M56}$ flows from the drain of transistor M52.

During operation, the equal currents $I_{M54}$ and $I_{M56}$ generated by the current generator 82 force the currents through transistors M54 and M56 to be equal. Because transistor M54 has a higher current density than transistor M56 (due to transistor M54 having a smaller conducting channel), the $V_{GS}$ of transistor M54, i.e., $V_{GSM54}$, is larger than the $V_{GS}$ of transistor M56, i.e., $V_{GSM56}$.

The drain-source current $I_{DS}$ of a MOSFET is equal to:

$$I_{DS} = \mu Co \frac{W}{L} (V_{GS} - V_{TH})^2$$

where,

W=conducting channel width;

L=conducting channel length;

$V_{TH}$=threshold voltage;

$$\mu(T) \propto \frac{1}{T^{1.5}} \; ; \text{and}$$

T=temperature From this equation it follows that, if the $I_{DS}$ of a MOSFET is held constant, then $V_{GS}$ will increase when temperature increases, and vice versa. Thus, because the current generator 82 maintains both $I_{M54}$ and $I_{M56}$ at a relatively constant level, $V_{GSM54}$ and $V_{GSM56}$ will both increase when temperature increases and both decrease when temperature decreases. Furthermore, because transistor M54 has a higher current density than transistor M56, the $V_{GSM54}$ will increase or decrease more than the $V_{GSM56}$.

The current through resistor R30 is equal to:

$$I_{R30} = (V_{GSM54} - V_{GSM56})/R30$$

Furthermore, $$I_{R30} = I_{M56}$$

As temperature increases, $V_{GSM54}$ and $V_{GSM56}$ both increase with $V_{GSM54}$ increasing more than $V_{GSM56}$. Thus, the difference between $V_{GSM54}$ and $V_{GSM56}$ increases as temperature increases which causes $I_{R30}$, and thus, $I_{M56}$, to increase. Because transistors M50 and M52 are connected to operate as a current mirror, $I_{M54}$ remains substantially equal to $I_{M56}$. Therefore, as $I_{M56}$ increases with increasing temperature, $I_{M54}$ also increases. Conversely, as $I_{M56}$ decreases with decreasing temperature, $I_{M54}$ also decreases.

Briefly summarizing, the drain-source current $I_{DS}$ of a MOSFET normally has a negative temperature coefficient, i.e., as temperature increases, decreases. However, the drain-source current $I_{M54}$ of transistor M54 has a positive temperature coefficient, i.e., as temperature increases, $I_{M54}$ increases. This phenomenon that occurs in the current generation stage 42 permits the other components of the circuit 40 to provide an output $V_{OP}$ to adjust the gate voltage of MOSFETs in order to compensate for variations in temperature.

It should also be noted that the positive temperature coefficient current generation stage 22 is normally not affected by variations in $V_{DD}$. Specifically, transistors M50 and M52 operate in the saturation range while conducting currents $I_{M54}$ and $I_{M56}$. If the supply voltage $V_{DD}$ changes, then the source-drain voltages $V_{SD}$ of each transistor M50 and M52 also change because the drains of transistors M54 and M56 are very high impedance. However, the currents $I_{M54}$ and $I_{M56}$ do not change because the transistors M50 and M52 are operating in saturation. Therefore, current $I_{M54}$, which has a positive temperature coefficient, is not affected by variations in $V_{DD}$, and, as will be seen, the source-drain currents conducted by transistors M13 and M14 in the driver 30 are also not affected by variations in $V_{DD}$.

It is envisioned that the n-channel transistors M54 and M56 could be replaced with p-channel transistors, and that the p-channel current generating transistors M50 and M52 could be replaced with n-channel transistors. In this scenario, p-channel transistors M54 and M56 would have different size conducting channels and have their sources coupled to $V_{DD}$, and n-channel transistors M50 and M52 would have equal size conducting channels and have their sources coupled to ground.

An n-channel transistor M57, which is optional, is used to filter out noise that may be present on the ground line. Transistor M57 is capacitor connected between ground and the gates of transistors M54 and M56, i.e., transistor M57 has its source and drain coupled to ground and its gate coupled to the gates of transistors M54 and M56.

Noise that is present on the ground line will reach the sources of transistors M54 and M56 via their connections to ground. Capacitor connected transistor M57 will let noise pass to the gates of transistors M54 and M56. Because the noise is present at both the gate and source of transistors M54 and M56, the $V_{GS}$ of each transistor should remain relatively constant.

The programmable current transfer and modification stage generates a current $I_{M58}$ that may be selectively programmed to be any one of several values that are linear proportional to current $I_{M54}$ conducted by the channel of transistor M54. This programmability allows current $I_{M54}$ to be "modified" to have a desired value, and, whatever value is selected, current $I_{M58}$ will have a positive temperature coefficient. Thus, the temperature compensation provided by outputs $V_{OP}$ and $V_{ON}$ is capable of inducing currents in transistors M13 and M14 that are a fraction or a multiple of current $I_{M54}$.

The current transfer and modification stage 44 includes four n-channel transistors M60, M62, M64, and M66 that each have a different size current conducting channel. Each of the transistors M60, M62, M64, and M66 has its gate coupled to the gate of transistor M54 and its drain coupled to the drain of transistor M58. Furthermore, each of the transistors M60, M62, M64, and M66 forms a current mirror with transistor M54; in other words, the $V_{GS}$ of transistor M54 will be substantially equal to the $V_{GS}$ of each one of the transistors M60, M62, M64, and M66.

The current transfer and modification stage 44 also includes four n-channel transistors M70, M72, M74, and M76 which respectively couple the source of each of the transistors M60, M62, M64, and M66 to ground. The purpose of transistors M70, M72, M74, and M76 is to permit current $I_{M58}$ to be selectively programmed to be conducted by the channel of only one of the transistors M60, M62, M64, and M66 at a time. The gate inputs $V_{GM70}$, $V_{GM72}$, $V_{GM74}$, and $V_{GM76}$, which switch transistors M70, M72, M74, and M76 "on" and "off", respectively, will normally be set such that only one of transistors M60, M62, M64, and M66 conducts current. Transistor M60 conducts current when transistor M70 is "on", transistor M62 conducts current when transistor M72 is "on", and so on In the embodiment shown in FIG. 6, transistor M60 has a channel width=80 μm and a channel length =2 μm, transistor M62 has a channel width=40 µm and a channel length=2 µm, transistor M64 has a channel width=27 µm and a channel length=2 µm, and transistor M66 has a channel width=20 µm and a channel length=2 µm. Furthermore, transistor M70 has a channel width=160 µm and a channel length=2 µm, transistor M72 has a channel width=80 µm and a channel length=2 µm, transistor M74 has a channel width=56 µm and a channel length=2 µm, and transistor M76 has a channel width=40 µm and a channel length=2 µm.

Current $I_{M58}$ will vary according to the "on/off" status of transistors M70, M72, M74, and M76 because these transistors determine which one of the transistors M60, M62, M64, and M66, which all have different channel sizes, will conduct current $I_{M58}$. Current $I_{M58}$ can be made equal to a fraction or a multiple of $I_{M54}$ by adjusting the channel size of the transistor which conducts $I_{M58}$. For example, when $I_{M58}$ is conducted through transistor M60, $I_{M58}$ will be twice as large as $I_{M54}$ because transistor M60's channel is twice as large as transistor M54's channel; when $I_{M58}$ is conducted through transistor M62, $I_{M58}$ will be equal to $I_{M54}$ because transistor M62's channel is the same size as transistor M54's channel. Thus:

$$
\begin{aligned}
I_{M58} &= 2\, I_{M54} && \text{when } M70 \text{ is ON} \\
        &= 1\, I_{M54} && \text{when } M72 \text{ is ON} \\
        &= 0.67\, I_{M54} && \text{when } M74 \text{ is ON} \\
        &= 0.5\, I_{M54} && \text{when } M76 \text{ is ON}
\end{aligned}
$$

By selectively programming the inputs $V_{GM70}$, $V_{GM72}$, $V_{GM74}$, and $V_{GM76}$, current $I_{M54}$ is "transferred" to current $I_{M54}$ and "modified" to be a fraction or multiple of $I_{M54}$. The inputs $V_{GM70}$, $V_{GM72}$, $V_{GM74}$, and $V_{GM76}$ are controlled by logic circuitry which will be discussed below with reference to FIGS. 7A and 7B.

It should be noted that, because transistors M70, M72, M74, and M76 each have a channel size that is twice as large as their respective transistors M60, M62, M64, and M66, the presence of transistors M70, M72, M74, and M76 does not significantly affect the current mirror relationship between transistor M54 and transistors M60, M62, M64, and M66.

Using the mirror effect and adjusting the channel size of transistor M62 may seem like a complex way to modify $I_{M54}$ because $I_{M54}$ can also be modified by adjusting the value of resistor R30. However, the temperature coefficient of $I_{M56}$ varies with its current level which is a function of the value of R30 and the channel width and length of transistors M54 and M56. Therefore, it is not desirable to adjust $I_{M54}$ by varying R30 because such variation will also change $I_{M54}$'s temperature coefficient.

The transfer and modification stage 44 also includes an optional capacitor connected p-channel transistor M59 that is coupled between $V_{DD}$ and the gate of transistor M58 in order to filter out noise that may be present in the $V_{DD}$ line. Specifically, transistor M59's source and drain are coupled to $V_{DD}$ and its gate is coupled to the gate of transistor M58.

The output stage 46 is coupled to the gate of transistor M58. The purpose of the output stage 46 is to generate two currents, $I_{M82}$ and $I_{M84}$, that are linearly proportional to current $I_{M58}$. Current $I_{M82}$ is used to generate output voltage $V_{ON}$ for application to the gates of n-channel MOSFETs to compensate for variations in temperature, and current $I_{M84}$ is used to generate output voltage $V_{OP}$ for application to the gates of p-channel MOSFETs to compensate for variations in temperature.

A p-channel transistor M80 has its source coupled to $V_{DD}$, its gate coupled to the gate of transistor M58, and its drain coupled to the drain of an n-channel transistor M82. Transistor M82 has its gate is coupled to its drain and its source coupled to ground. The channels of transistors M80 and M82 conduct current $I_{M82}$, and the gate of transistor M82 provides output $V_{ON}$.

Transistor M80 forms a current mirror with transistor M58; thus, the $V_{GS}$ of the two transistors will be substantially equal. Current $I_{M82}$ will be linear proportional to current $I_{M58}$ and have a positive temperature coefficient. The value of $I_{M82}$ will depend on the channel size of transistor M80. In the embodiment shown in FIG. 6, transistor M80 has a channel width=50 µm and a channel length=1 µm, and transistor M82 has a channel width=10 µm and a channel length=1 µm. Because transistor M80 has a larger channel than transistor M58, current $I_{M82}$ will be larger than current $I_{M58}$. It Should be understood, however, that by adjusting the channel size of transistor M80, the strength of $I_{M82}$ can be adjusted, and by adjusting the channel size of transistor M82, the output voltage $V_{ON}$, which is equal to $V_{GSM82}$, can be adjusted.

By connecting output $V_{ON}$ to the gate of n-channel transistor M4, a current mirror is formed between transistor M82 and transistor M4. Thus, the current conducted by the channel of transistor M4 will be linear proportional to $I_{M82}$ and have a positive temperature coefficient.

A p-channel transistor M84 has its source coupled to $V_{DD}$, its gate coupled to its drain, and its drain coupled to the drain of an n-channel transistor M86. Transistor M86 has its source coupled to ground and its gate coupled to the gate of transistor M82. The channels of transistors M84 and M86 conduct current $I_{M84}$, and the gate of transistor M84 provides output $V_{OP}$.

Transistor M86 forms a current mirror with transistor M82; thus, the $V_{GS}$ of the two transistors will be substantially equal. Current $I_{M84}$ will be linear proportional to currents $I_{M82}$ and $I_{M58}$, and have a positive temperature coefficient. The value of $I_{M84}$ will depend on the channel size of transistor M86. In the embodiment shown in FIG. 6, transistor M86 has a channel width=26 µm and a channel length =1 µm, and transistor M84 has a channel width=80 µm and a channel length=1 µm. Because transistor M86 has a larger channel than transistor M82, current $I_{M84}$ will be larger than current $I_{M82}$. It should be understood, however, that by adjusting the channel size of transistor M86, the strength of $I_{M84}$ can be adjusted, and by adjusting the channel size of transistor M84, the output voltage $V_{OP}$, which is equal tO $V_{SGM84}$, Can be adjusted.

By connecting output $V_{OP}$ to the gate of p-channel transistor M13, a current mirror is formed between transistor M84 and transistor M13. Thus, the current conducted by the channel of transistor M13 will be linear proportional to $I_{M84}$ and have a positive temperature coefficient.

Optional capacitor connected p-channel transistor M88 and n-channel transistor M90 filter noise that may be present on the $V_{DD}$ and ground lines, respectively. Transistor M88 has its source and drain coupled to VDD and its gate coupled to the gate of transistor M84. Transistor M90 has its source and drain coupled to ground and its gate coupled to the gates of transistors M82 and M86.

The purpose of the start-up stage 48 is to feed current to transistor M54 when the voltage supply $V_{DD}$ initially starts from ground level so that transistor M54's conducting channel can begin to conduct current.

An n-channel transistor M94 has its drain coupled to $V_{DD}$ and its source coupled to the drain of transistor M54. A diode connected p-channel transistor M92 is coupled between $V_{DD}$ and the gate of transistor M94, and two diode connected n-channel transistors M96 and M98 couple the gate of transistor M94 to ground. In the embodiment shown in FIG. 6, transistor M94 has a channel width=5 μm and a channel length=2 μm, transistor M92 has a channel width=3 μand a channel length=100 μm, and transistors M96 and M98 have channel widths=60 μm and channel lengths=2 μm. The channel sizes of transistors M92, M94, M96, and M98 may be varied to suit the needs of a particular application.

When voltage supply $V_{DD}$ initially starts from ground level, none of the transistors carry current. When $V_{DD}$ rises above three times the threshold voltage, i.e., 3 $V_{TH}$, of transistor M94, transistor M94 feeds current into the drain of transistor M54. As the channel of transistor M54 begins to conduct current, a voltage drop is induced across the gate and source of transistor M56. Transistor M56 begins to conduct current which causes transistor M52 to begin to conduct current. Due to the current mirror action, transistor M50 also begins to conduct current which feeds back to transistor M54. This positive feedback continues until the current conducted by transistor M56 reaches its final value. Because the gate of transistor M94 is clamped by diode connected transistors M96 and M98, the rise of the drain potential of transistor M54 eventually shuts off transistor M94.

Figures 7A, 7B:
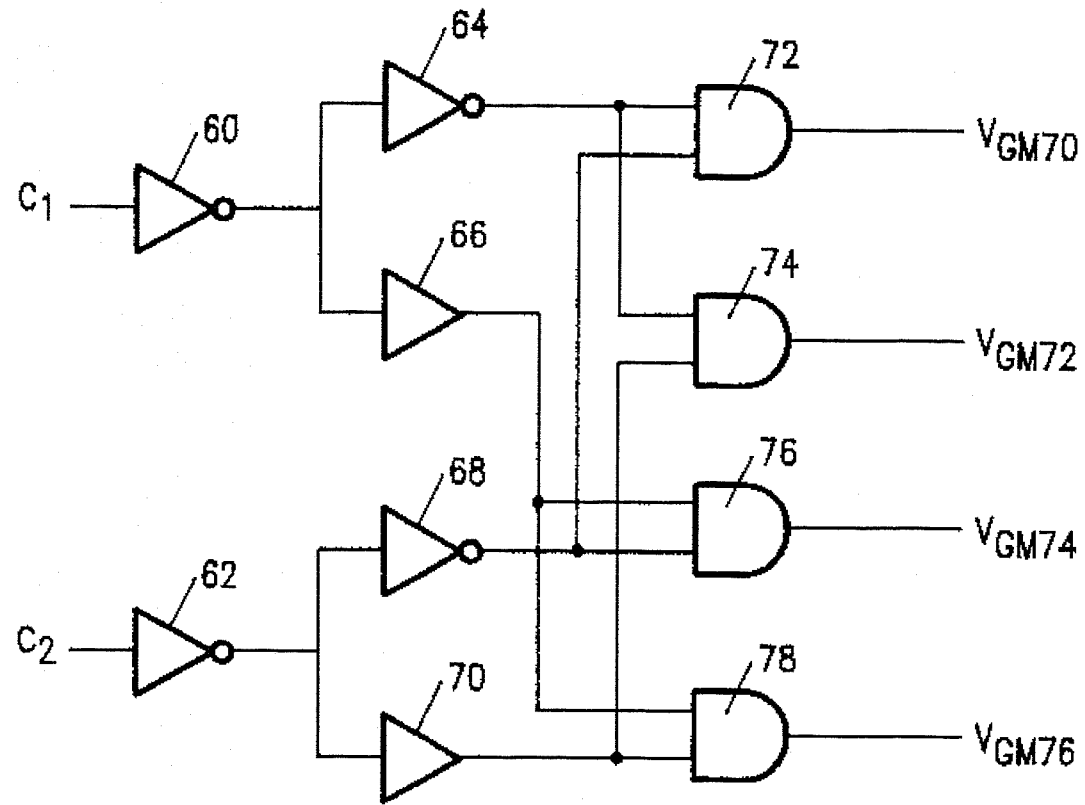
FIG. 7A is a schematic diagram illustrating control logic circuitry that may be used for programming the temperature compensation circuit shown in FIG. 6.
FIG. 7B is a truth table for the control logic circuitry shown in FIG. 7A.

FIG. 7A shows the control logic circuitry for programming transistors M70, M72, M74, and M76 so that only one of transistors M60, M62, M64, and M66 conducts current $I_{M58}$ at a time. The control logic includes two inverters 60 and 62 that receive at their inputs control signals C1 and C2, respectively. The output of inverter 60 is coupled to the input of an inverter 64 and the input of a buffer 66, and the output of inverter 62 is coupled to the input of an inverter 68 and the input of a buffer 70.

Four AND gates 72, 74, 76, and 78 receive the outputs of inverters 64 and 68 and buffers 66 and 70. Specifically, AND gate 72 receives the outputs of inverters 64 and 68, AND gate 74 receives the outputs of inverter 64 and buffer 70, AND gate 76 receives the outputs of buffer 66 and inverter 68, and AND gate 78 receives the outputs of buffers 66 and 70. AND gates 72, 74, 76, and 78 have their outputs $V_{GM70}$, $V_{GM72}$, $V_{GM74}$, and $V_{GM76}$ coupled to the gates of transistors M70, M72, M74, and M76, respectively.

FIG. 7B shows a truth table for the logic circuit of FIG. 7A. For each combination of control signals C1 and C2, only one of the outputs $V_{GM70}$, $V_{GM72}$, $V_{GM74}$, and $V_{GM76}$ will be logic "1" at a time.

It should be understood that the programmability feature of the current transfer and modification stage 44 that is implemented by the use of the several transistors M60, M62, M64, M66, M70, M72, M74, and M76, as well as the control logic circuitry shown in FIG. 7A, is optional. Current $I_{M54}$ may be modified, i.e., amplified, by simply substituting for transistors M60, M62, M64, and M66 various transistors that have various different channel sizes.

In addition, it should be well understood that the specific channel sizes of the MOSFETs shown in FIGS. 5 through 8 and recited herein may be adjusted to achieve various different amplifications of the generated currents and voltages without deviating from the spirit of the present invention.

The rise time $t_r$, fall time $t_f$, edge rate, turn-on delay, turn-off delay, and propagation delay of the prior art driver 20 discussed above are sensitive to temperature and voltage supply VDD variations because the current levels conducted by transistors M2 and M3 vary with such temperature and supply variations. The levels of current conducted by transistors M2 and M3 directly relate to the driver 20's rise time $t_r$, fall time $t_f$, etc. However, the temperature compensation circuit 34 of the present invention causes the currents conducted by transistors M11 and M12 (via transistors M13 and M14) of the diver 30 to be compensated for such temperature variations. Furthermore, as discussed above, the temperature compensation circuit 34 also causes the currents conducted by transistors M13 and M14 (and thus, transistors M11 and M12) to not be affected by variations in $V_{DD}$. Thus, the rise time $t_r$, fall time $t_f$, edge rate, turn-on delay, turn-off delay, and propagation delay of the driver 30 are relatively insensitive to temperature and voltage supply VDD variations.

The temperature compensation circuit 34 also causes the driver 30's rise time $t_r$, fall time $t_f$, edge rate, turn-on delay, turn-off delay, and propagation delay to be relatively insensitive to process variations because the current conducted by transistors M11 and M12 is set, and can be adjusted by, the temperature compensation circuit 34.

Because the improvements in the rise time $t_r$, fall time $t_f$, edge rate, turn-on delay, turn-off delay, and propagation delay due to the temperature compensation circuit 34 and the discharge circuit 36, the driver 30 has low output pulse distortion and may be operated at a data rate up to 250 MHz.

Figure 8A:
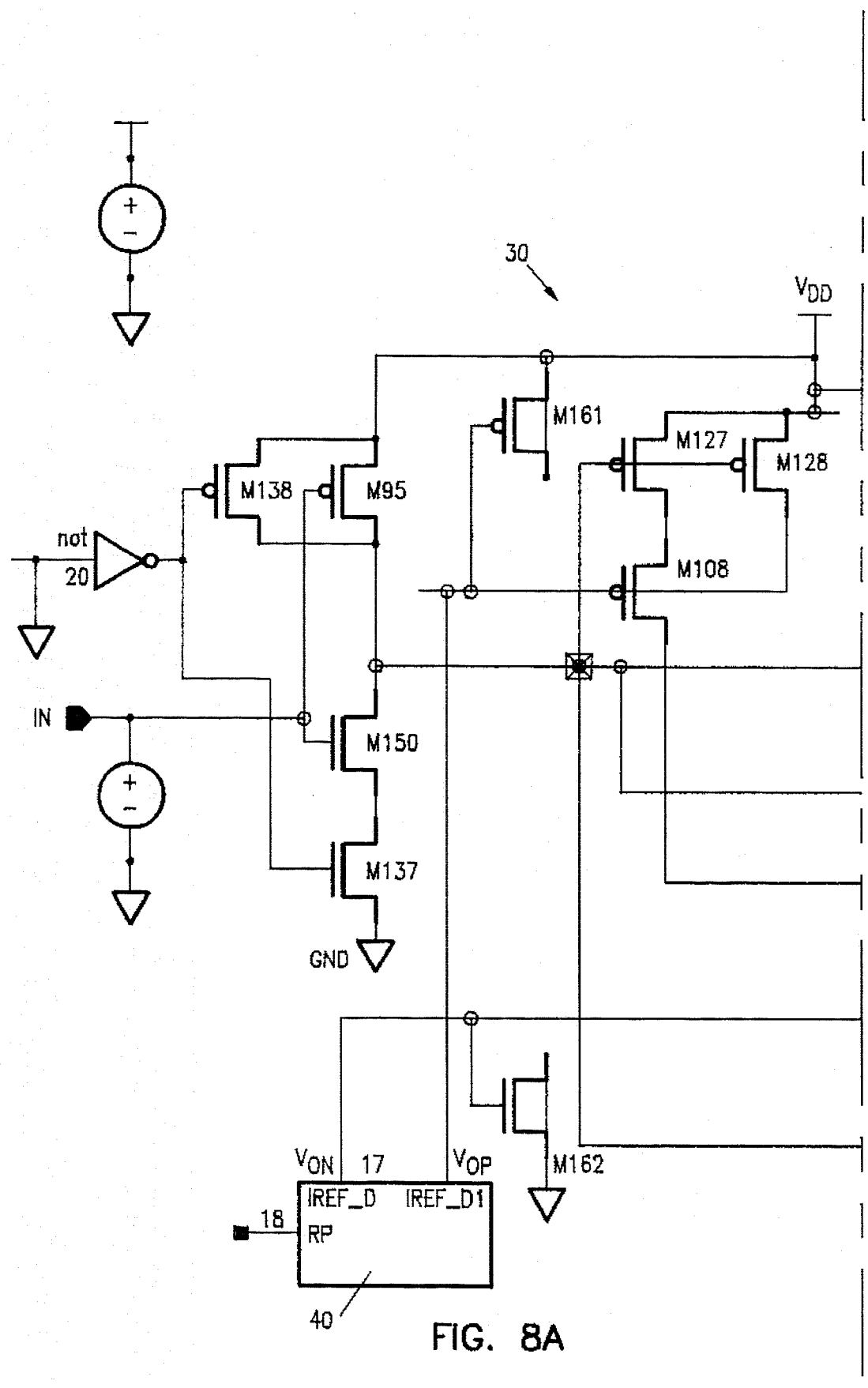
FIG. 8 is a detailed schematic diagram illustrating the CMOS transmission line driver shown in FIG. 5.
Figure 8B:
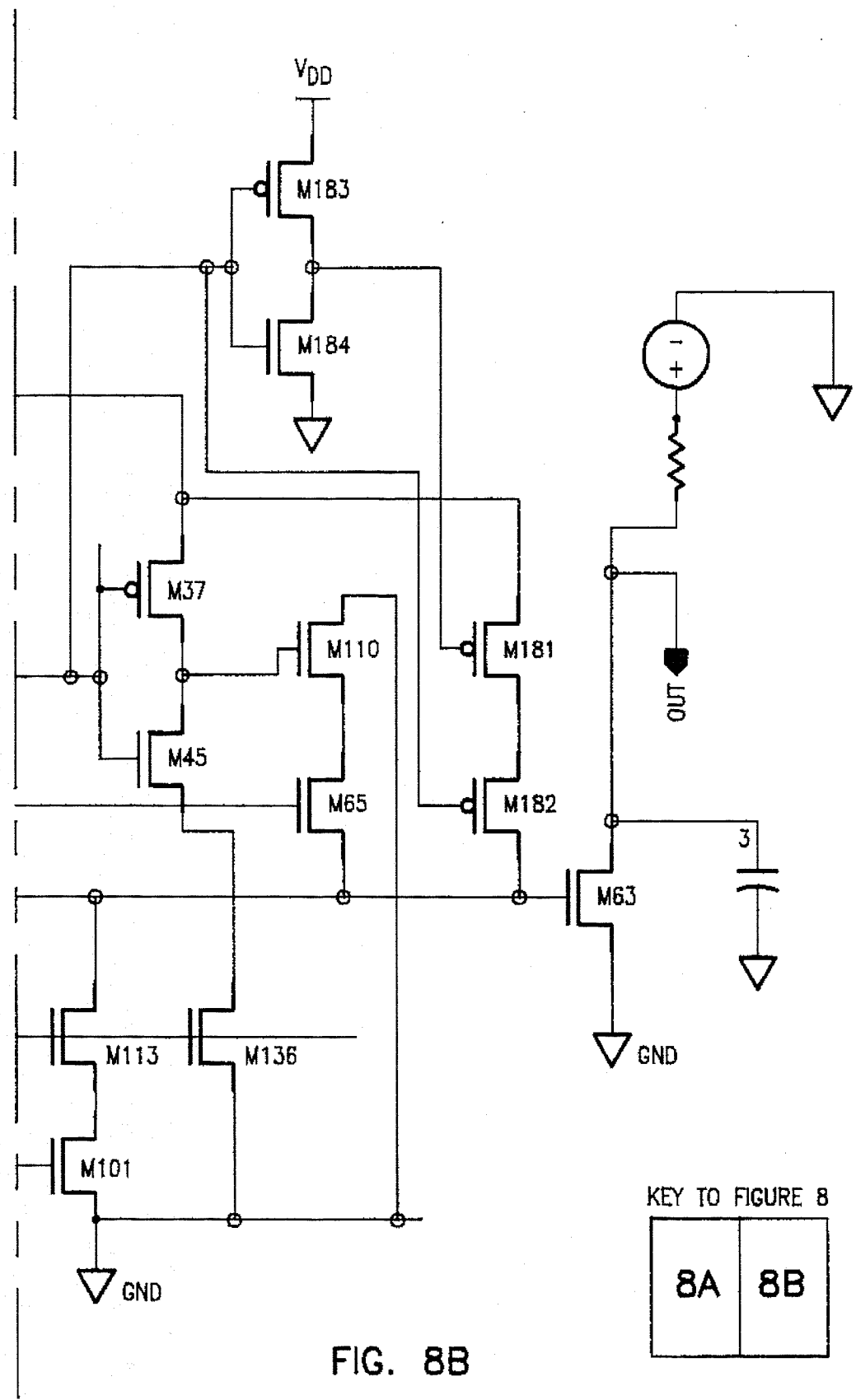

FIG. 8 shows a more detailed schematic of the driver 30. In this figure it is seen that inverter 37 is made up of a p-channel transistor M55 and an n-channel transistor M45, and that inverter 38 is made up of a p-channel transistor M93 and an n-channel transistor M95. Furthermore, inverter 37 is grounded through an n-channel transistor M136. The gate of transistor M136 is coupled to output VON of the temperature adjusting circuitry 40. An additional p-channel transistor M128 forms a current mirror with transistor M11. The drain of transistor M128 is coupled to the gate of transistor M13. FIG. 8 also shows the channel sizes for all of the transistors.

Figure 9:
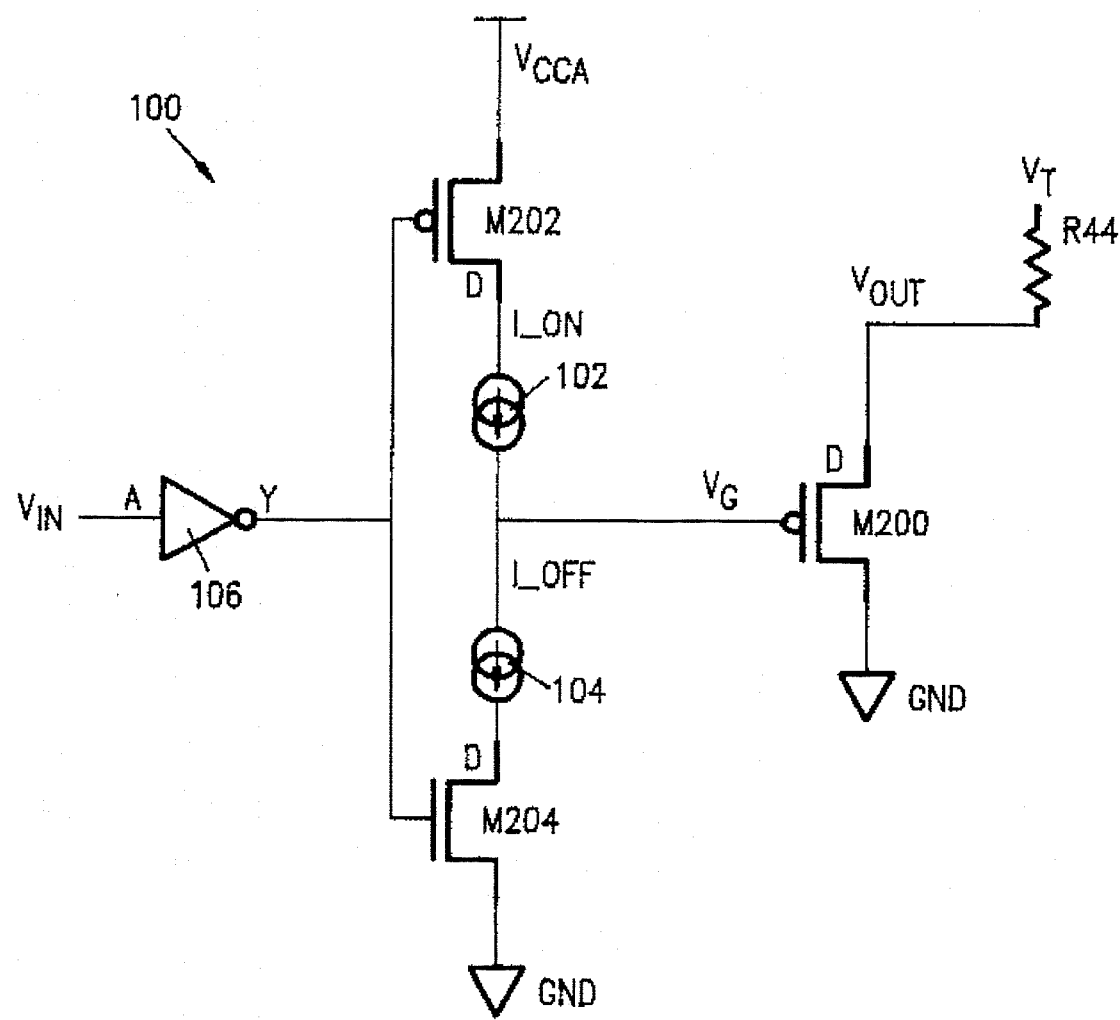
FIG. 9 is a schematic diagram illustrating a CMOS transmission line driver in accordance with the invention described in the parent application cross-referenced herein.

The driver 30 shown in FIGS. 5 and 8 was described in the parent application cross-referenced herein. The present invention provides several improvements to the driver 30. In order to best describe the improvements, the basic operation of the driver 30, without the discharge circuit 36, will be reviewed in detail. FIG. 9 shows a driver 100 that is substantially similar to the driver 30, except for the elimination of the discharge circuit 36. The current sources 102 and 104 represent, and provide the same function as, the temperature compensation circuit 34 described above.

Figure 10:
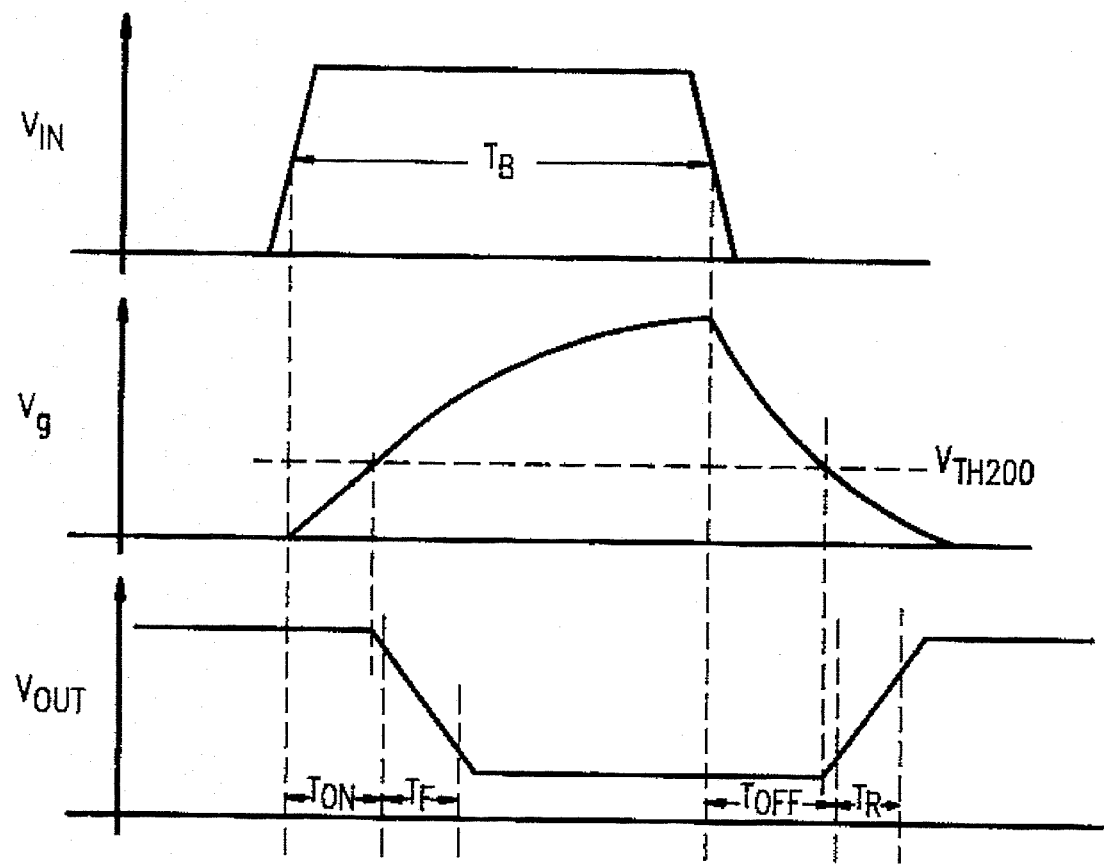
FIG. 10 is a timing diagram illustrating some of the signal levels generated by the transmission line driver shown in FIG. 9.

FIG. 10 shows the input voltage waveform $V_{in}$, the voltage waveform $V_g$ present at the gate of the output transistor M200, and the output voltage waveform $V_{out}$ present at the drain of the output transistor M200, for the driver 100. Initially, the input voltage $V_{in}$ is low (i.e., logic 0) which causes transistor M204 to be in the conducting state. Transistor M204 pulls the gate of transistor M200, i.e., the voltage $V_g$, low, which causes transistor M200 to be in the nonconducting state. When trasistor M200 is in the nonconducting state, its drain, i.e., the output voltage $V_{out}$, is high.

When the input voltage $V_{in}$ reaches the 50% level on the low to high (i.e., logic 1) transition, transistor M202 begins to conduct current to charge the gate of transistor M200 and cause the voltage $V_g$ to begin to rise. When the voltage $V_g$ reaches the threshold voltage of transistor M200, transistor M200 begins to conduct current and the output voltage $V_{out}$ begins to fall. The time from when the voltage $V_g$ begins to rise to when the output voltage $V_{out}$ has fallen 10% is referred to herein as the turn on delay time $T_{ON}$ or the propagation delay time of the output $V_{out}$ falling edge. As the voltage $V_g$ rises, the output voltage $V_{out}$ continues to fall. The time it takes the output voltage $V_{out}$ to fall from 10% to 90% of its full drop is referred to herein as the fall time $T_F$. After the output voltage $V_{out}$ reaches its low level, the voltage $V_g$ continues to rise to its peak level.

When the input voltage $V_{in}$ falls to the 50% level on the high to low transition, transistor M204 begins to conduct current to discharge the gate of transistor M200 and cause the voltage $V_g$ to begin to fall. When the voltage $V_g$ decreases to the threshold voltage of transistor M200, transistor M200 begins to enter the nonconducting state and the output voltage $V_{out}$ begins to rise. The time from when the voltage $V_g$ begins to fall to when the output voltage $V_{out}$ has risen 10% is referred to herein as the turn off delay time $T_{OFF}$ or the propagation delay time of the output $V_{out}$ rising edge. As the voltage $V_g$ decreases, the output voltage $V_{out}$ continues to rise. The time it takes the output voltage $V_{out}$ to rise from 10% to 90% of its full swing is referred to herein as the rise time $T_R$.

It should be noted that if the fall and rise times $T_F$ and $T_R$ are equal, then the turn off delay time $T_{OFF}$ will be greater than the turn on delay time $T_{ON}$. This is true because it takes longer for the voltage $V_g$ to fall from its peak value to the threshold voltage of transistor M200 than it takes for the voltage $V_g$ to rise to the threshold voltage of transistor M200.

In general, high speed CPUs and synchronous DRAMs drive the need for data rates greater than 50 MHz. The data rate of the driver 100 is given by the equation:

Data Rate=$1/T_B$ where $T_B$ is the pulse width of the input voltage $V_{in}$. Thus, the data rate is increased by decreasing the input pulse width $T_B$.

One way to decrease the input pulse width $T_B$ is to decrease the turn on and turn off delay times $T_{ON}$ and $T_{OFF}$. The turn on and turn off delay times $T_{ON}$ and $T_{OFF}$ can be decreased by increasing the slope with which the voltage $V_g$ rises and falls. The slope with which the voltage $V_g$ rises and falls can be increased by adjusting the strength of the current sources 102 and 104 which charge and discharge the gate of transistor M200. However, if the slope of the voltage $V_g$ is increased in order to decrease the turn on and turn off delay times $T_{ON}$ and $T_{OFF}$, the fall and rise times $T_F$ and $T_R$ will also be decreased. The fall and rise times $T_F$ and $T_R$ will be decreased because they are also dependent on the slope of the voltage $V_g$.

A decrease the fall and rise times $T_F$ and $T_R$ is undesirable because it results in an increase in the edge rate. Specifically, the edge rate of the driver 100 is given by the equations:

Edge Rate=$\Delta V_{out}/T_F$=$\Delta V_{out}/T_R$

In general, a low edge rate is more desirable because it reduces bus or transmission line ringing caused by reflection due to impedance mismatch, allows longer stub lengths with less ringing, reduces far end and near end crosstalk, reduce ground bouncing and voltage supply ringing, and reduces electromagnetic interference (EMI). The far end crosstalk is directly proportional to edge rate. Therefore, in order to maintain a low edge rate, the fall and rise times $T_F$ and $T_R$ should not be decreased.

Figure 11A:
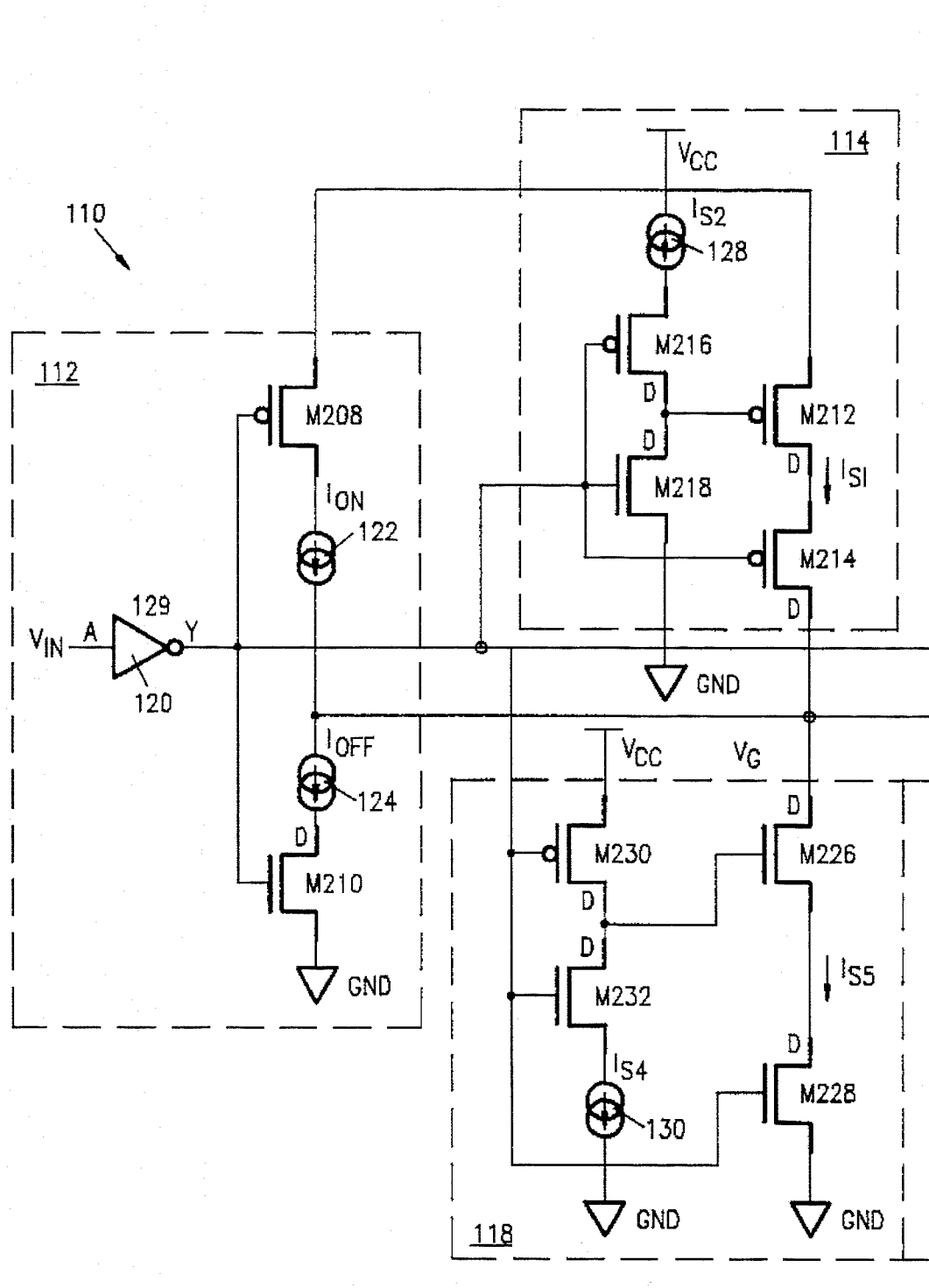
FIG. 11 is a schematic diagram illustrating a CMOS transmission line driver in accordance with the present invention.
Figure 11B:
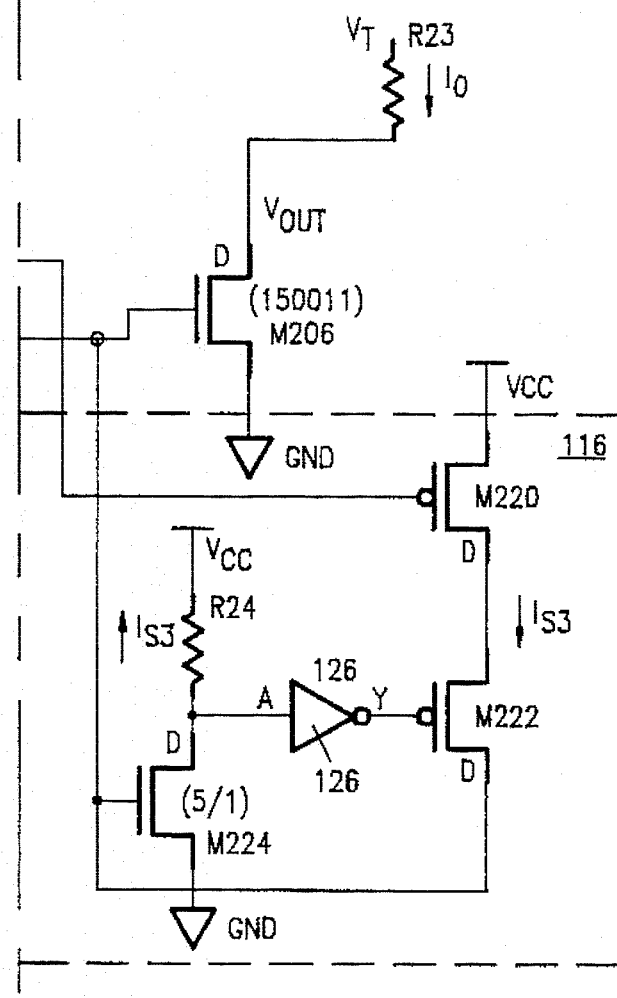

FIG. 11 shows a CMOS transmission line driver 110 in accordance with the present invention. The driver 110 includes circuitry that decreases the turn on and turn off delay times $T_{ON}$ and $T_{OFF}$ without significantly decreasing the fall and rise times $T_F$ and $T_R$. Thus, the data rate of the driver 100 is increased without increasing the edge rate.

The driver 110 includes an n-channel output transistor M206 having a wide channel. Preferably, transistor M206 has a channel width of 1500 μm and a channel length of 1 μm. An input circuit 112 is coupled to the gate of transistor M206 for charging and discharging the gate of transistor M206. The input circuit 112 is the same as that used for the driver 100 discussed above. Specifically, the input circuit 112 includes an inverter 120 having its output coupled to the gates of a p-channel transistor M208 and an n-channel transistor M210. Positive temperature coefficient current sources 122 and 124 are connected in series with the drains of transistors M208 and M210. The positive temperature coefficient current sources 122 and 124 are substantially the same design as the temperature compensation circuit 34 described above.

A first falling edge speed-up circuit 114 is used to decrease the turn on delay time $T_{ON}$ for the output voltage $V_{out}$ falling edge. As will be explained in more detail below, the speed-up circuit 114 decreases the turn on delay time $T_{ON}$ by providing an extra charging current $I_{S1}$ to the gate of transistor M206 for a period of time long enough to quickly charge the gate to its threshold level.

The first falling edge speed-up circuit 114 includes two p-channel transistors M212 and M214 connected in series between the voltage supply $V_{CC}$ and the gate of transistor M206. The gate of transistor M214 is coupled to the output of the inverter 120. The gate of transistor M212 is coupled to the drains of a p-channel transistor M216 and an n-channel transistor M218. The drains and gates of transistors M216 and M218 are coupled together with the gates being coupled to the output of the inverter 120. The source of transistor M218 is grounded, and the source of transistor M216 is coupled through a current source 128 to the voltage supply $V_{CC}$.

The current source 128 has a negative temperature coefficient and a negative voltage supply coefficient. In other words, when temperature increases, the current provided by the current source decreases, and when the voltage supply increases, the current provided by the current source 128 decreases. The design and operation of the current source 128 will be explained in more detail below.

A gate charging speed-up circuit 116 (or second falling edge speed-up circuit 116) is used to quickly increase the gate voltage $V_g$ of transistor M206 to the voltage supply $V_{CC}$ value. This significantly reduces the input voltage $V_{in}$ data pulse width $T_B$ (i.e., increase the data rate) without affecting the edge rate of the falling output $V_{out}$. Similar to the speed-up circuit 114, the speed-up circuit 116 accomplishes this task by providing an extra charging current $I_{S3}$ to the gate of transistor M206 for an amount of time long enough to quickly charge the gate to the $V_{DD}$ level.

The gate charging speed-up circuit 116 includes two p-channel transistors M220 and M222 connected in series between the voltage supply $V_{CC}$ and the gate of transistor M206. The gate of transistor M220 is connected to the output of the inverter 120. The gate of transistor M222 is connected to the output of two series connected inverters 126. It is important to note that the block designated by reference numeral 126 represents two series connected inverters; thus, the block 126 as a whole does not invert. The input of the two series connected inverters 126 is connected to the drain of a sensing n-channel transistor M224 that has its source grounded and its gate connected to the gate of transistor M206. The drain of transistor M224 is coupled through a resistor R24 to the voltage supply $V_{CC}$. The sensing transistor M224 preferably has a channel width of 5 μm and a channel length of 1 μm.

A rising edge speed-up control circuit 118 is used to decrease the turn off delay time $T_{OFF}$ for the output voltage $V_{out}$ rising edge. The turn off delay time $T_{OFF}$ is decreased without affecting the edge rate of the rising output $V_{out}$. As will be explained in more detail below, the control circuit 118 accomplishes this task by providing an extra discharge current $I_{S5}$ to the gate of transistor M206 for an amount of time long enough to quickly discharge the gate down to its threshold level.

The rising edge speed-up control circuit 118 includes two n-channel transistors M226 and M228 connected in series between the gate of transistor M206 and ground. The gate of transistor M228 is coupled to the output of the inverter 120. The gate of transistor M226 is coupled to the drains of a p-channel transistor M230 and an n-channel transistor M232. The drains and gates of transistors M230 and M232 are coupled together with the gates being coupled to the output of the inverter 120. The source of transistor M230 is coupled to the voltage supply $V_{CC}$, and the source of transistor M232 is coupled through a current source 130 to ground.

Similar to the current source 128, the current source 130 has a negative temperature coefficient and a negative voltage supply coefficient. The negative temperature coefficient and the negative voltage supply coefficient causes the threshold voltage $V_{THM206}$ of transistor M206 to be insensitive to temperature variations and to be compensated for variations in the voltage supply $V_{CC}$. This results in the output $V_{out}$ rising edge remaining linearly controlled with variations in the voltage supply $V_{CC}$ and temperature.

Figure 12:
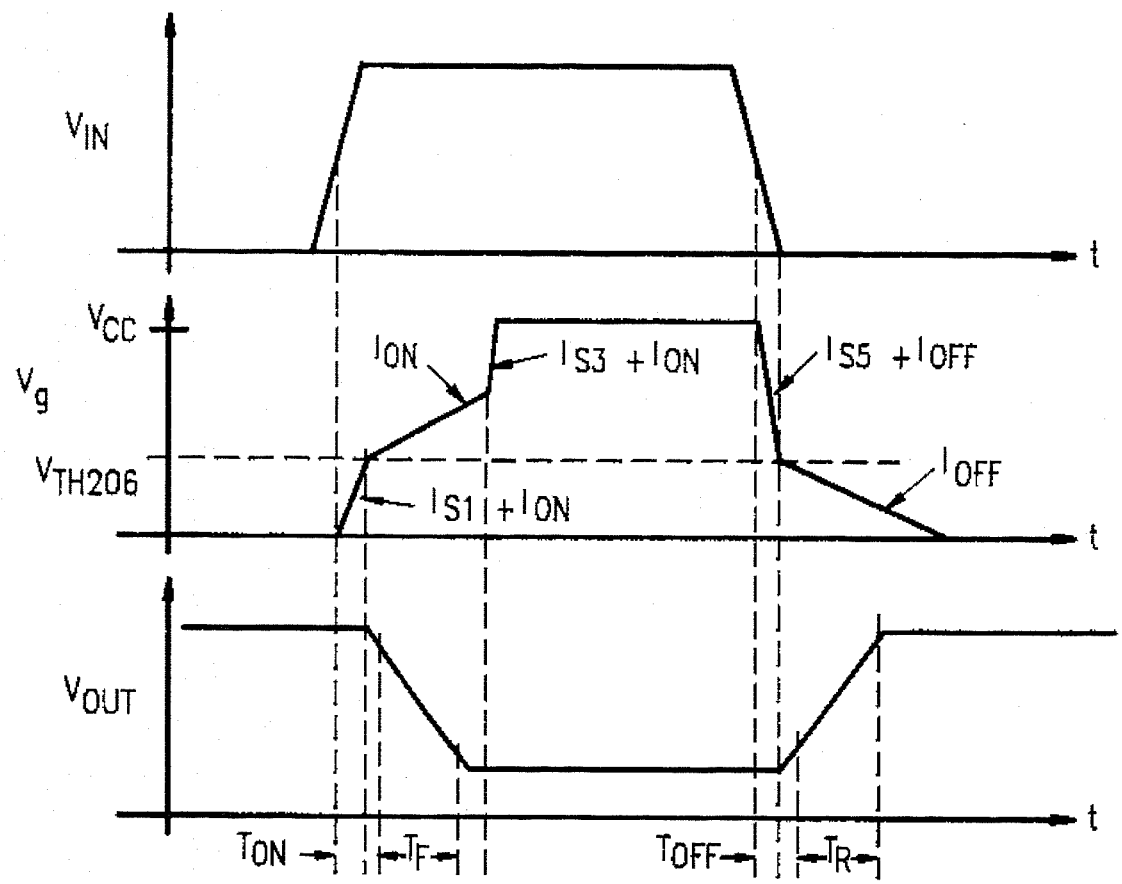
FIG. 12 is a timing diagram illustrating some of the signal levels generated by the transmission line driver shown in FIG. 11.

FIG. 12 shows the input voltage waveform $V_{in}$, the voltage waveform $V_g$ present at the gate of the output transistor M206, and the output voltage waveform $V_{out}$ present at the drain of the output transistor M206, for the driver 110. Initially, the input voltage $V_{in}$ is low (i.e., logic 0) which causes transistor M210 to be in the conducting state. Transistor M210 pulls the gate of transistor M206, i.e., the voltage $V_g$, low, which causes transistor M206 to be in the nonconducting state. When transistor M206 is in the nonconducting state, its drain, i.e., the output voltage $V_{out}$, is high. Furthermore, the low input $V_{in}$ causes transistor M218 to be in the conducting state which causes transistor M212 to be in the linear mode conducting state. However, no current is conducted by transistor M212 because transistor M214 is in the nonconducting state.

When the input Vin reaches the 50% point on the low to high (i.e., logic 1) transition, two different charging currents begin to charge the gate of transistor M206 and cause the voltage $V_g$ to begin to rise. First, as soon as the input $V_{in}$ goes high, transistor M208 begins to conduct the charging current $I_{on}$ which charges the gate of transistor M206. Second, transistor M214 quickly enters the conducting state and conducts the charging current $I_{S1}$ which also charges the gate of transistor M206. As shown in FIG. 12, the charging current $I_{S1}$ and the charging current $I_{on}$ quickly charge the gate of transistor M206 to its threshold level $V_T$.

Transistor M214 continues to conduct the charging current $I_{S1}$ until the current source 128 and transistor M216 charge the gate of transistor M212 above its threshold level such that it enters the nonconducting state. Once transistor M212 switches into the nonconducting state, transistor M214 stops conducting the charging current $I_{S1}$. Therefore, the charging current $I_{S1}$ is provided to the gate of transistor M206 for the amount of time it takes transistors M216 and M218 and the current source 128 to switch transistor M212 off. It follows that the amount of time that the charging current $I_{S1}$ is conducted, i.e., its width, is inversely proportional to the current $I_{S2}$ generated by the current source 128.

When the voltage $V_g$ reaches the threshold voltage $V_{THM206}$ of transistor M206, transistor M206 begins to conduct current and the output voltage $V_{out}$ begins to fall. Because the voltage $V_g$ is charged to the threshold level $V_{THM206}$ very quickly, the turn on delay time $T_{ON}$ for the falling edge of the output $V_{out}$ is significantly reduced from that of the driver 100 shown in FIG. 9. However, once the voltage $V_g$ reaches the threshold level $V_{THM206}$, the charging current $I_{S1}$ stops and only the charging current $I_{on}$ continues to charge the gate of transistor M206. At this point the gate of transistor M206 is not charged as rapidly and the output $V_{out}$ falling edge is permitted to fall gradually with approximately the same fall time $T_F$ as that of the driver 100 shown in FIG. 9. The smaller the charging current $I_{on}$, the longer the fall time $T_F$. Because the fall time $T_F$ is not significantly decreased, the edge rate is maintained at approximately the same low level as that of the driver 100 shown in FIG. 9. Therefore, the turn on delay time $T_{ON}$ of the driver 110 is reduced without increasing the edge rate of the falling edge of the output $V_{out}$.

During the time that the currents $I_{on}$ and $I_{S1}$ charge the gate of transistor M206, the currents $I_{on}$ and $I_{S1}$ also charge the gate of the sensing transistor M224. When the output $V_{out}$ falls to the low level, i.e., the drain of transistor M206 falls to the low level, the drain of the sensing transistor M224 also falls to the low level. Thus, the sensing transistor M224 "senses" when the output $V_{out}$ has fallen to the low level. Because the sensing transistor M224 has a very small channel size compared to transistor M206, the sensing transistor M224 conducts only a small fraction of the current $I_o$ conducted by transistor M206.

When the drain of the sensing transistor M224 goes low, the output of the two inverters 126 go low which pulls the gate of transistor M222 low. The gate of transistor M220 is already pulled low by the output of the inverter 120. Because their gates are pulled low, transistors M220 and M222 conduct the current $I_{S3}$ which quickly charges the gate of transistor M206, i.e., the voltage $V_g$, to the $V_{CC}$ level. The current $I_{S3}$ stops when the voltage $V_g$ reaches the $V_{CC}$ level.

Because the current $I_{S3}$ is not conducted to the gate of transistor M206 until the output $V_{out}$ reaches the low level, the fall time $T_F$ of the output $V_{out}$ is not cut short. Therefore, the edge rate of the falling edge of the output $V_{out}$ is not affected by the current $I_{S3}$. The advantage of using the current $I_{S3}$ to quickly charge the gate of transistor M206 to the $V_{CC}$ level is that the voltage $V_g$ is quickly stabilized at the level where it is ready for the input $V_{in}$ to go low again.

When the input $V_{in}$ reaches the 50% point on the high to low (i.e., logic 0) transition, two discharging currents begin to discharge the gate of transistor M206. First, when the input $V_{in}$ goes low, transistor M210 begins to conduct the current $I_{off}$ which begins to discharge the gate of transistor M206. Second, transistor M228 quickly enters the conducting state and conducts the current $I_{S5}$ which discharges the gate of transistor M206.

Before the input $V_{in}$ goes low, transistor M230 is conducting which pulls the gate of transistor M226 high. Because its gate is pulled high, transistor M226 is in the conducting state. However, transistor M226 does not conduct current because the gate of transistor M228 is pulled low. When the input $V_{in}$ goes low, transistor M228 quickly enters the conducting state and conducts the current $I_{S5}$. Transistors M226 and M228 conduct the current $I_{S5}$ until transistor M226 switches to the nonconducting state.

The current $I_{S5}$ is an instant current the duration of which is dependent on the transition of the gate of transistor M226. In other words, transistor M228 continues to conduct the current $I_{S5}$ until transistor M226 is switched into the nonconducting state. Transistor M226 is switched into the nonconducting state by transistor M230 switching off and transistor M232 switching on to pull the gate of transistor M226 low. The speed with which transistor M226 is switched into the nonconducting state is dependent on the strength of the current $I_{S4}$ generated by the current source 130. Therefore, if the value of the current $I_{S4}$ is small, the $I_{S5}$ current pulse is longer and the gate of transistor M206 is discharged faster.

The current $I_{S5}$ stays on until the gate of transistor M206, i.e., the voltage $V_g$, is discharged down to the threshold level $V_{THM206}$ of transistor M206. The current $I_{S5}$ is stopped at this point by designing the current source $I_{S4}$ such that the gate voltage $V_{gM226}$ of transistor M226 reaches its threshold voltage $V_{THM226}$ at the same time that the voltage $V_g$ reaches the threshold voltage $V_{THM206}$ of transistor M206.

When the value of the voltage $V_g$ reaches the threshold voltage $V_{THM206}$, transistor M206 begins to switch to the nonconducting state and the output $V_{out}$ begins to rise. After the current $I_{S5}$ stops, the current $I_{off}$ continues to discharge the gate of transistor M206 until it is fully discharged. At that point, the output $V_{out}$ rising edge rate is fully controlled by the value of the current $I_{off}$. The smaller the current $I_{off}$, the longer the rise time $T_R$.

Because the current $I_{S5}$ discharges the gate of transistor M206 very quickly, the turn off delay time $T_{OFF}$ is much shorter than that of the driver 100 shown in FIG. 9. However, because the current $I_{S5}$ shuts off when the voltage $V_g$ reaches the threshold level $V_{THM206}$, the output $V_{out}$ rises gradually and the rise time $T_R$ is not significantly reduced from that shown in FIG. 9. Therefore, the edge rate of the rising edge of the output $V_{out}$ remains at about the same level as that of the driver 100.

Figure 13A:
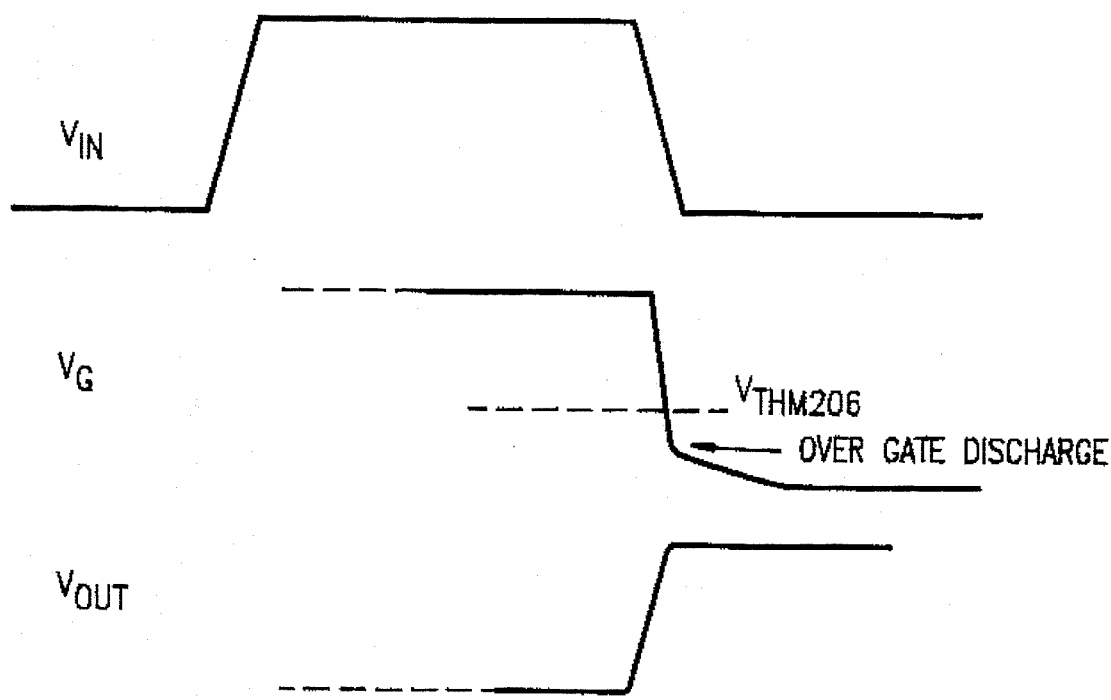
FIGS. 13A and 13B are timing diagrams illustrating some of the signal levels generated by the transmission line driver shown in FIG. 11.
Figure 13B:
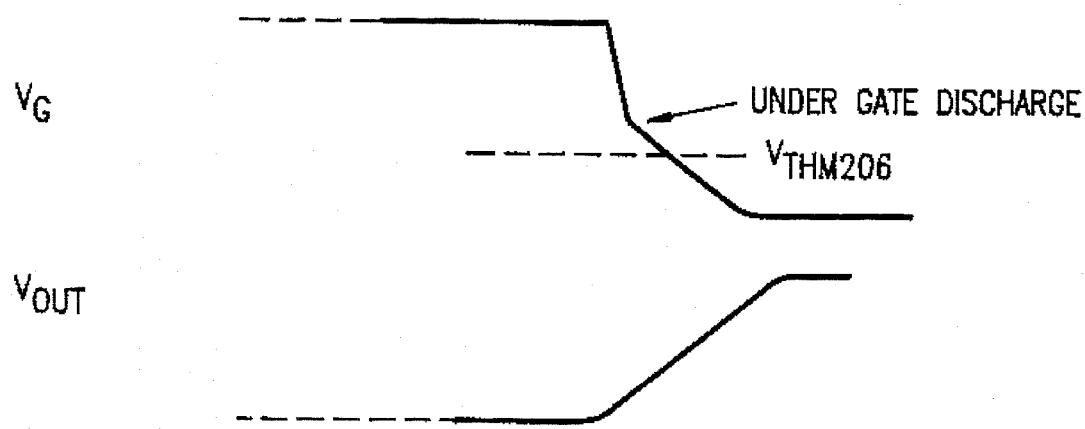

The current $I_{S5}$ should turn off just at the point where the voltage $V_g$ reaches the threshold voltage $V_{THM206}$. FIG. 13A shows the effect of the current $I_{S5}$ remaining on too long. When the current $I_{S5}$ remains on too long, i.e., the current $I_{S5}$ pulse is too wide, it continues to discharge the gate of transistor M206 even after it has reached the threshold level $V_{THM206}$. This gate over-discharge causes the rising edge of the output $V_{out}$ to rise very quickly which results in a short rise time $T_R$. A short rise time $T_R$ increases the edge rate which, as discussed above, is undesirable. On the other hand, FIG. 13B shows the effect of the current $I_{S5}$ not remaining on long enough. When the current $I_{S5}$ is not on long enough, i.e., the current $I_{S5}$ pulse is to narrow, it shuts off before the gate of transistor M206 is discharged down to the threshold level $V_{THM206}$. This gate under-discharge causes the rising edge of the output $V_{out}$ to rise very slowly which results in a long rise time $T_R$ and a long turn off delay time $T_{off}$. As discussed above, a long turn off delay time $T_{off}$ is not desirable because it decreases the data rate of the driver.

In order to prevent over and under discharging of the gate of transistor M206, the value of the current $I_4$ generated by the current source 130 should be set such that the gate voltage $V_{gM226}$ of transistor M226 reaches its threshold voltage $V_{THM226}$ at the same time that the voltage $V_g$ reaches the threshold voltage $V_{THM206}$ of the output transistor M206. When transistor M226 reaches its threshold voltage $V_{THM226}$, it stops conducting the current $I_{S5}$.

Figure 14:
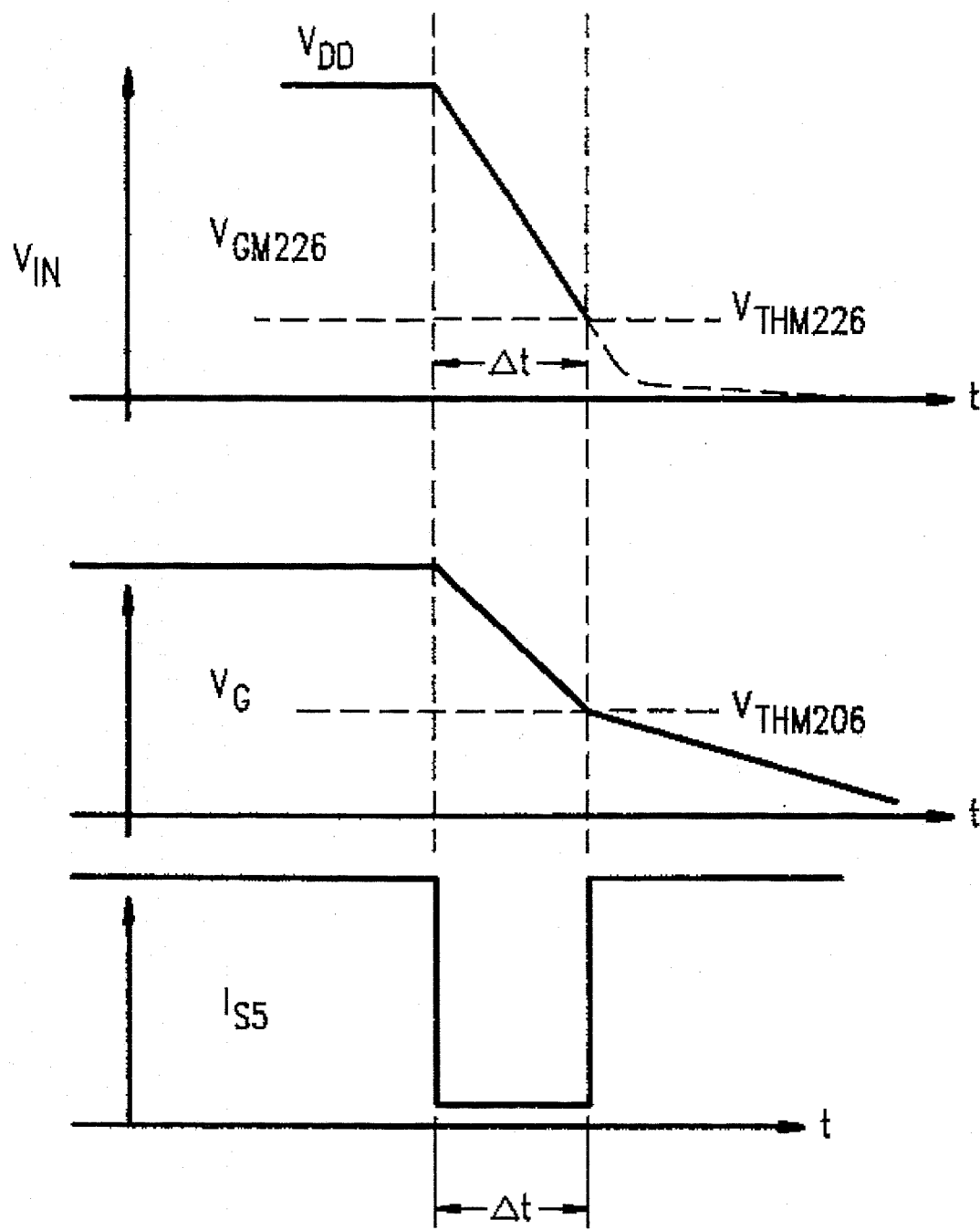
FIG. 14 is a timing diagram illustrating some of the signal levels generated by the transmission line driver shown in FIG. 11.

FIG. 14 shows that the current $I_{S5}$ is on for a period of time $\Delta t$. Therefore, $\Delta t$ is also the period of time that it takes the gate voltage $V_{gM226}$ to reach its threshold voltage $V_{THM226}$, as well as the period of time it takes the voltage $V_g$ to reach the threshold voltage $V_{THM206}$. In order to make the voltages $V_{gM226}$ and $V_g$ simultaneously reach their threshold voltages $V_{THM226}$ and $V_{THM206}$, respectively, the current $I_{S4}$ generated by the current source 130 is set according to the following equations.

The current $I_{S4}$ is given by the equation:

$$I_{S4} = C_{gM226}\frac{\Delta V_{gM226}}{\Delta t} \quad (1)$$

where $C_{gM226}$ is the gate capacitance of transistor M226. Rewriting this equation gives the following equation for the time period $\Delta t$:

$$\Delta t = \frac{C_{gM226}}{I_{S4}}\Delta V_{gM226} = \frac{C_{gM226}}{I_{S4}}(V_{CC} - V_{THM226}) \quad (2)$$

The current $I_{S5}$ is given by the equation:

$$I_{S5} = C_{gM206}\frac{\Delta V_g}{\Delta t} \quad (3)$$

where $C_{gM206}$ is the gate capacitance of transistor M206. Rewriting this equation gives the following equation the voltage $\Delta V_g$:

$$\Delta V_g = \frac{I_{S5}}{C_{gM206}}\Delta t \quad (4)$$

Substituting equation (2) into equation (4) gives the following equation for $\Delta V_g$:

$$\Delta V_g = \frac{I_{S5}}{I_{S4}}\frac{C_{gM226}}{C_{gM206}}(V_{CC} - V_{THM226}) \quad (5)$$

The threshold voltage $V_{THM206}$ of transistor M206 is given by the equation:

$$V_{THM206} = V_{CC} - \Delta V_g \quad (6)$$

Substituting equation (5) into equation (6) gives the following equation for $V_{THM206}$:

$$V_{THM206} = V_{CC} - \frac{I_{S5}}{I_{S4}}\frac{C_{gM226}}{C_{gM206}}(V_{CC} - V_{THM226}) \quad (7)$$

In order for the voltages $V_{gM226}$ and $V_g$ to simultaneously reach their threshold voltages $V_{THM226}$ and $V_{THM206}$, respectively, the threshold voltages $V_{THM226}$ and $V_{THM206}$ are made equal to each other. According to equation (7), the threshold voltages $V_{THM226}$ and $V_{THM206}$ are equal when:

$$\frac{I_{S5}}{I_{S4}} \cdot \frac{C_{gM226}}{C_{gM206}} \approx 1 \quad (8)$$

because:

$$V_{THM226} \approx V_{CC} - V_{CC} + V_{THM226} \approx V_{THM26} \quad (9)$$

Therefore, if the output transistor M206 and the rising edge speed-up control circuit 118 are designed according to equation (8), the current pulse $I_{S5}$ will be just wide enough to shut off when the voltage $V_g$ reaches the threshold level $V_{THM206}$ of transistor M206.

Figure 15A:
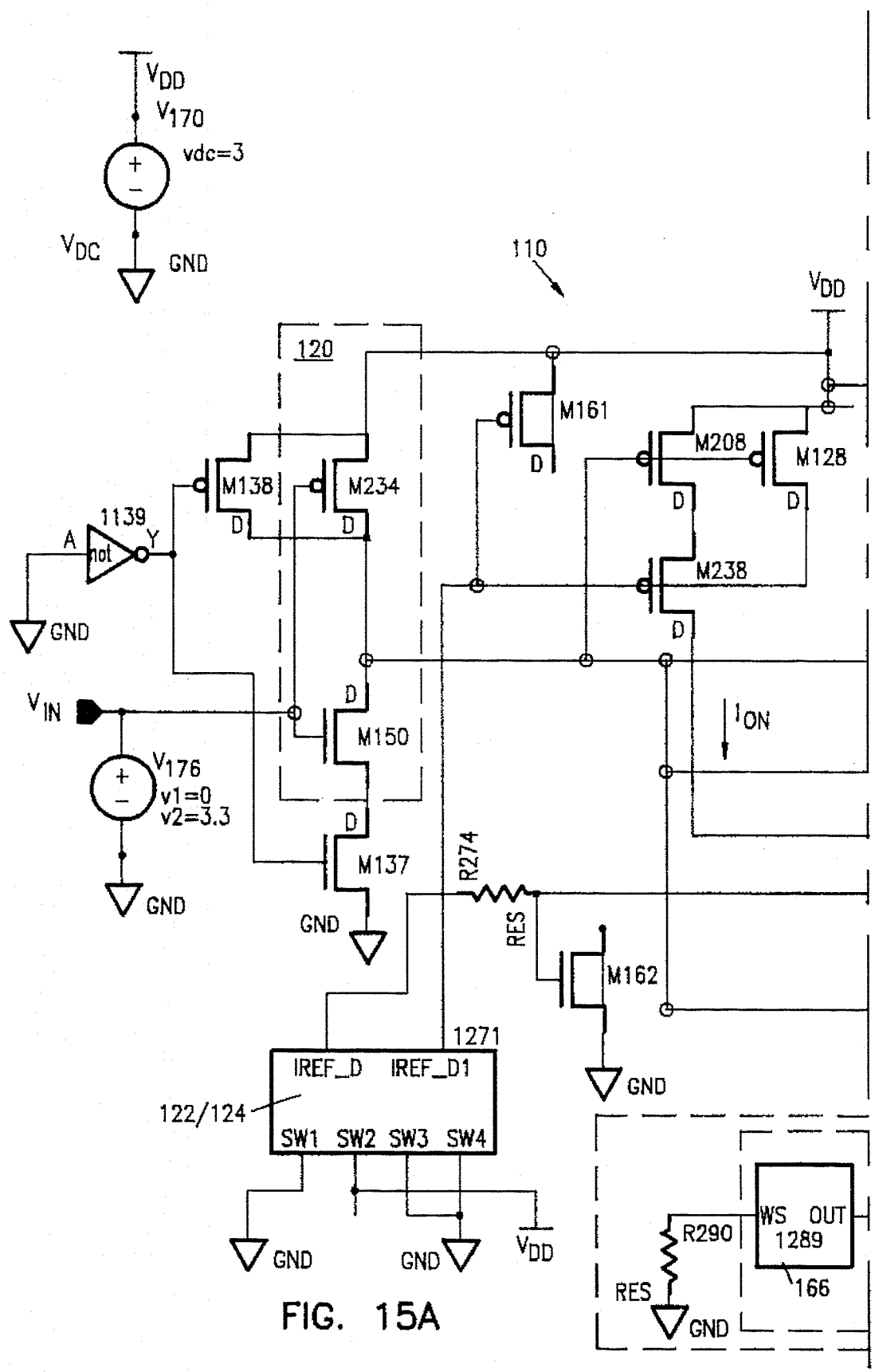
FIG. 15 is a detailed schematic diagram illustrating the CMOS transmission line driver shown in FIG. 11.
Figure 15B:
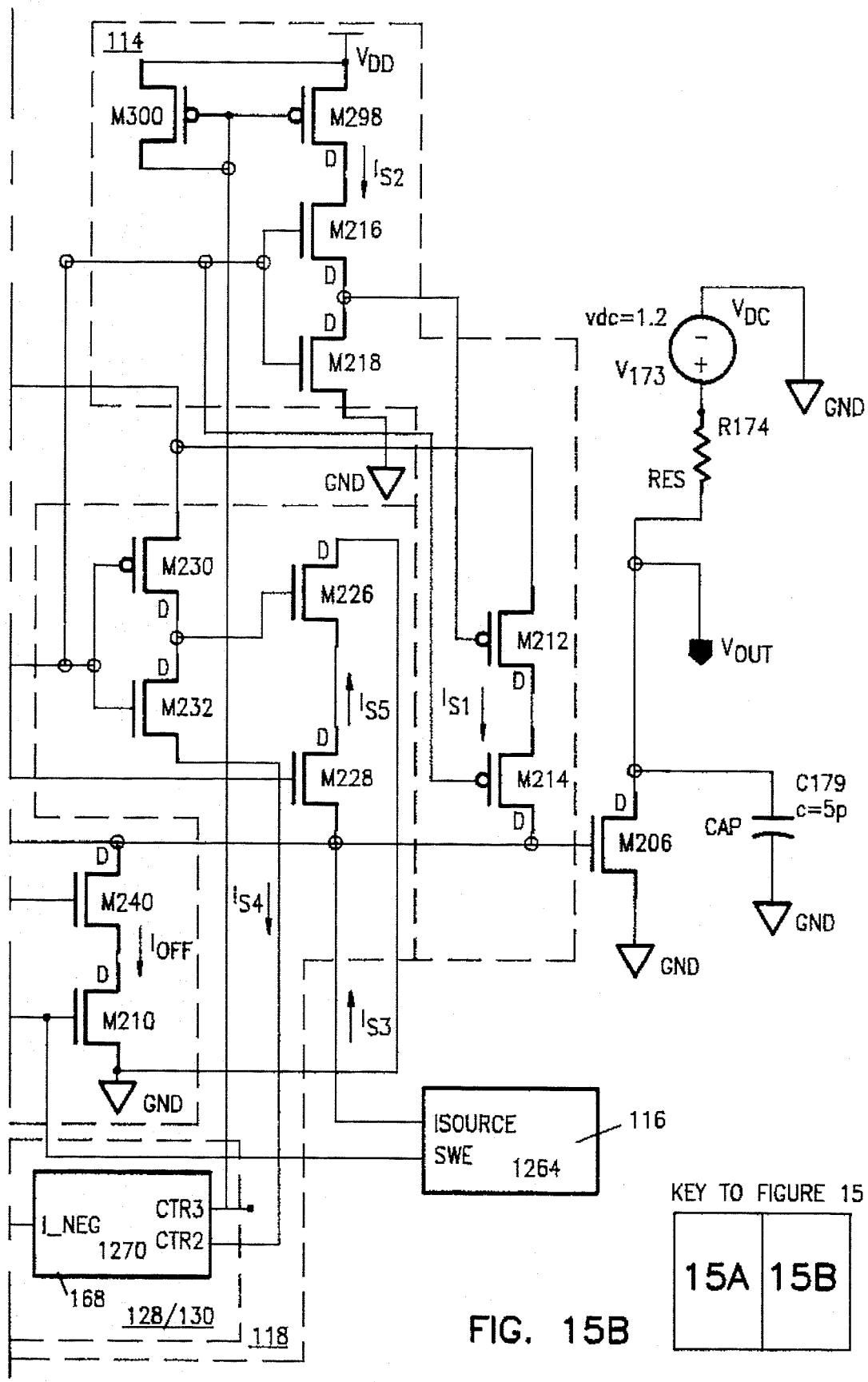

FIG. 15 shows a detailed schematic of the driver 110 shown in FIG. 11. The input inverter 120 is implemented with a p-channel transistor M234 and an n-channel transistor M236. Preferably, transistor M234 has a channel width of 80 µm and a channel length of 1 µm, and transistor M236 has a channel width of 150 µm and a channel length of 1 µm. Furthermore, transistor M208 has a channel width of 20 µm and a channel length of 1 µm, and transistor M210 has a channel width of 80 µm and a channel length of 1 µm.

The positive temperature coefficient current sources 122 and 124 are connected in series with transistors M208 and M210 by way of a p-channel transistor M238 and an n-channel transistor M240. Preferably, transistor M238 has a channel width of 110 µm and a channel length of 41 µm, and transistor M240 has a channel width of 80 µm and a channel length of 1 µm.

Figure 16A:
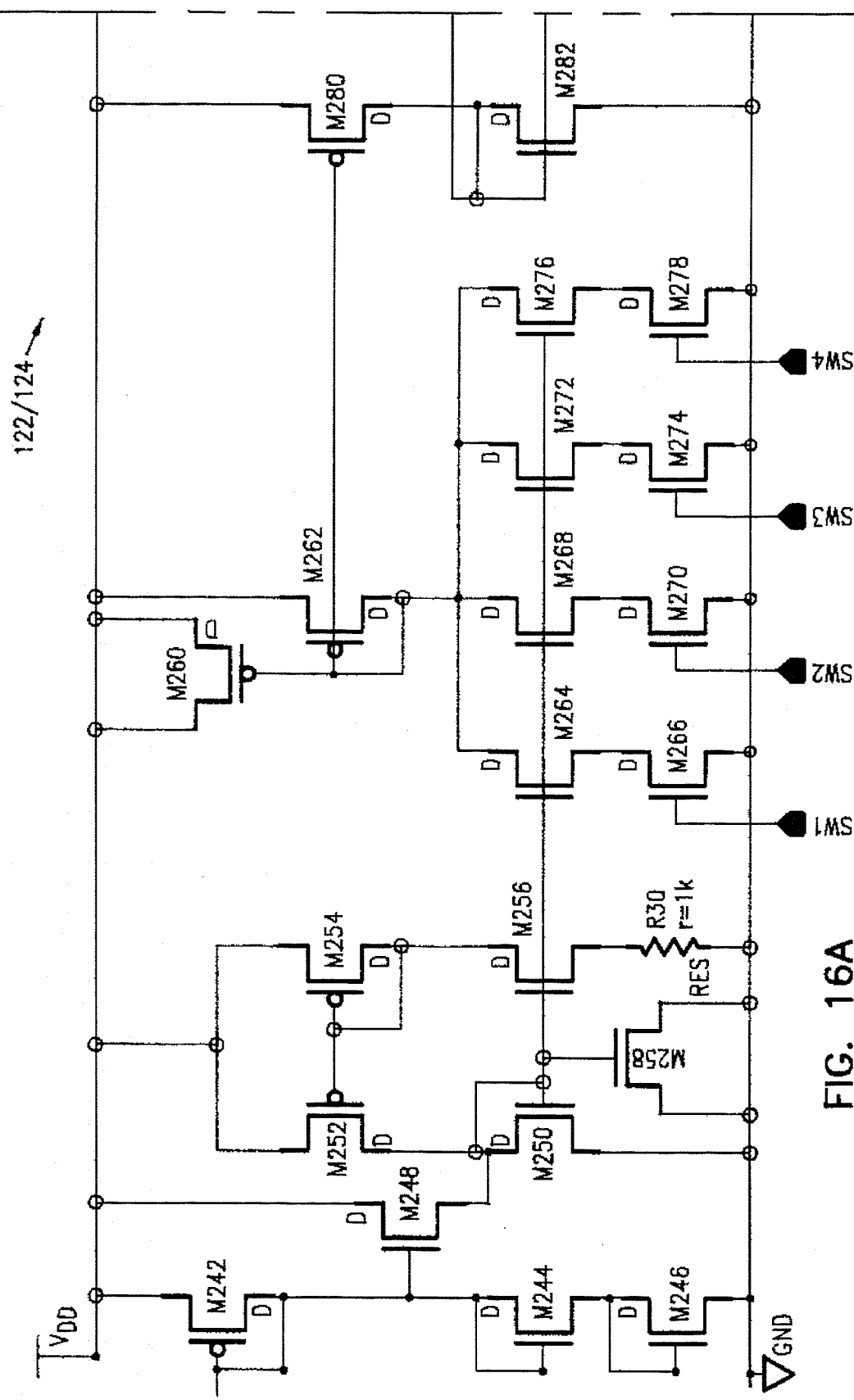
FIG. 16 is a schematic diagram illustrating a programmable CMOS temperature compensation circuit that may be used with the transmission line driver shown in FIG. 15.
Figure 16B:
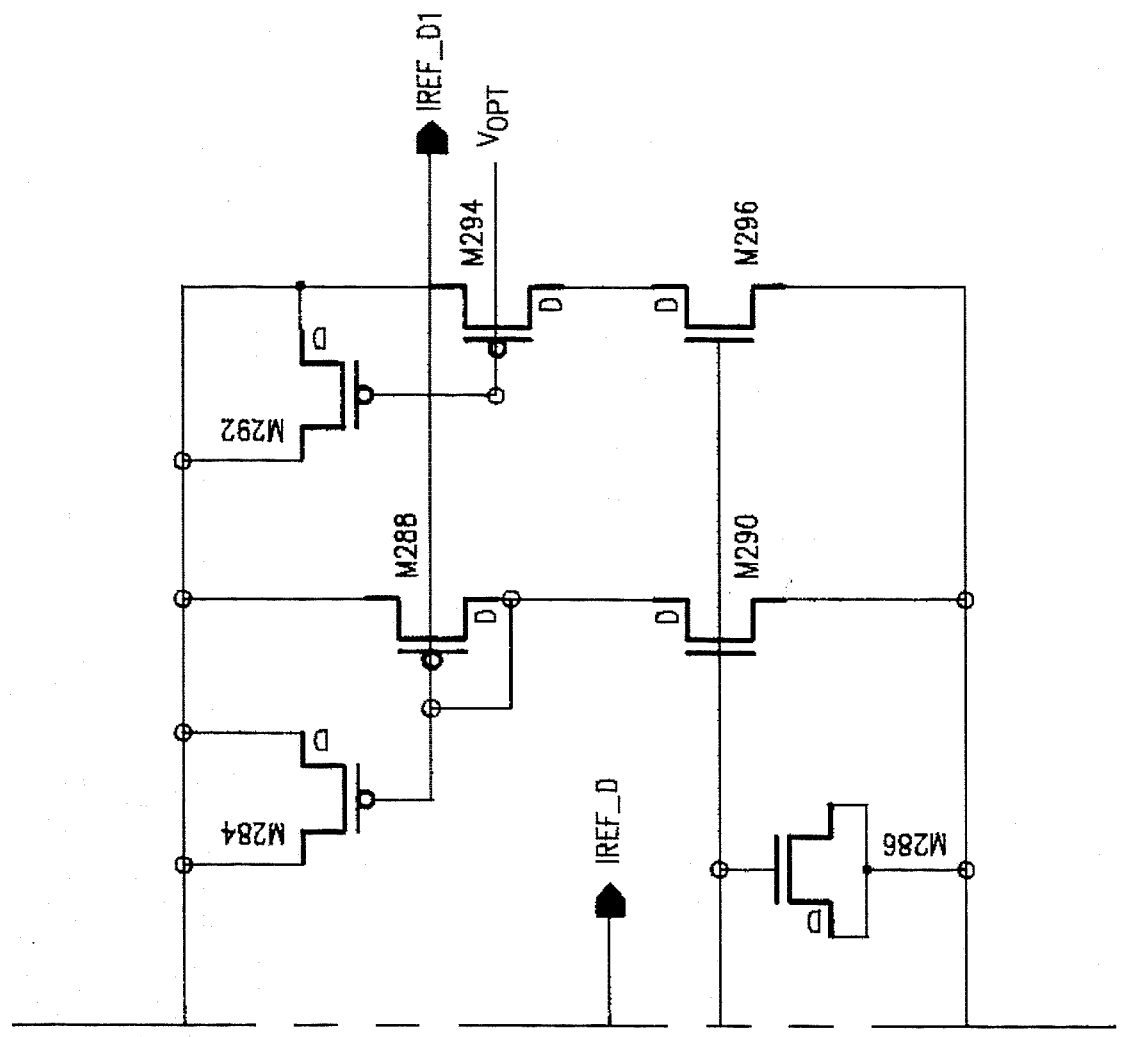

The positive temperature coefficient current sources 122 and 124 are implemented with one circuit 122/124 which is shown in detail in FIG. 16. The design and operation of the circuit 122/124 is substantially the same as the temperature adjusting circuitry 40 described above except for some of the channel sizes of the transistors and the addition of transistors M292, M294, and M296. The transistors M292, M294, and M296 provide an optional output $V_{opt}$ if needed.

The channel sizes of the transistors in the circuit 122/124 that are different from the temperature adjusting circuitry 40 is as follows:

| Transistor | channel width (µm) | channel length (µm) |
|---|---|---|
| M262 | 40 | 1 |
| M264 | 40 | 2 |
| M266 | 400 | 1 |
| M268 | 30 | 2 |
| M270 | 300 | 1 |
| M272 | 20 | 2 |
| M274 | 200 | 1 |
| M276 | 10 | 2 |
| M278 | 100 | 1 |
| M280 | 100 | 1 |
| M282 | 40 | 1 |
| M284 | 800 | 4 |
| M286 | 800 | 4 |
| M288 | 80 | 1 |
| M290 | 52 | 1 |
| M292 | 800 | 4 |
| M294 | 80 | 1 |
| M296 | 52 | 1 |

Figure 17:
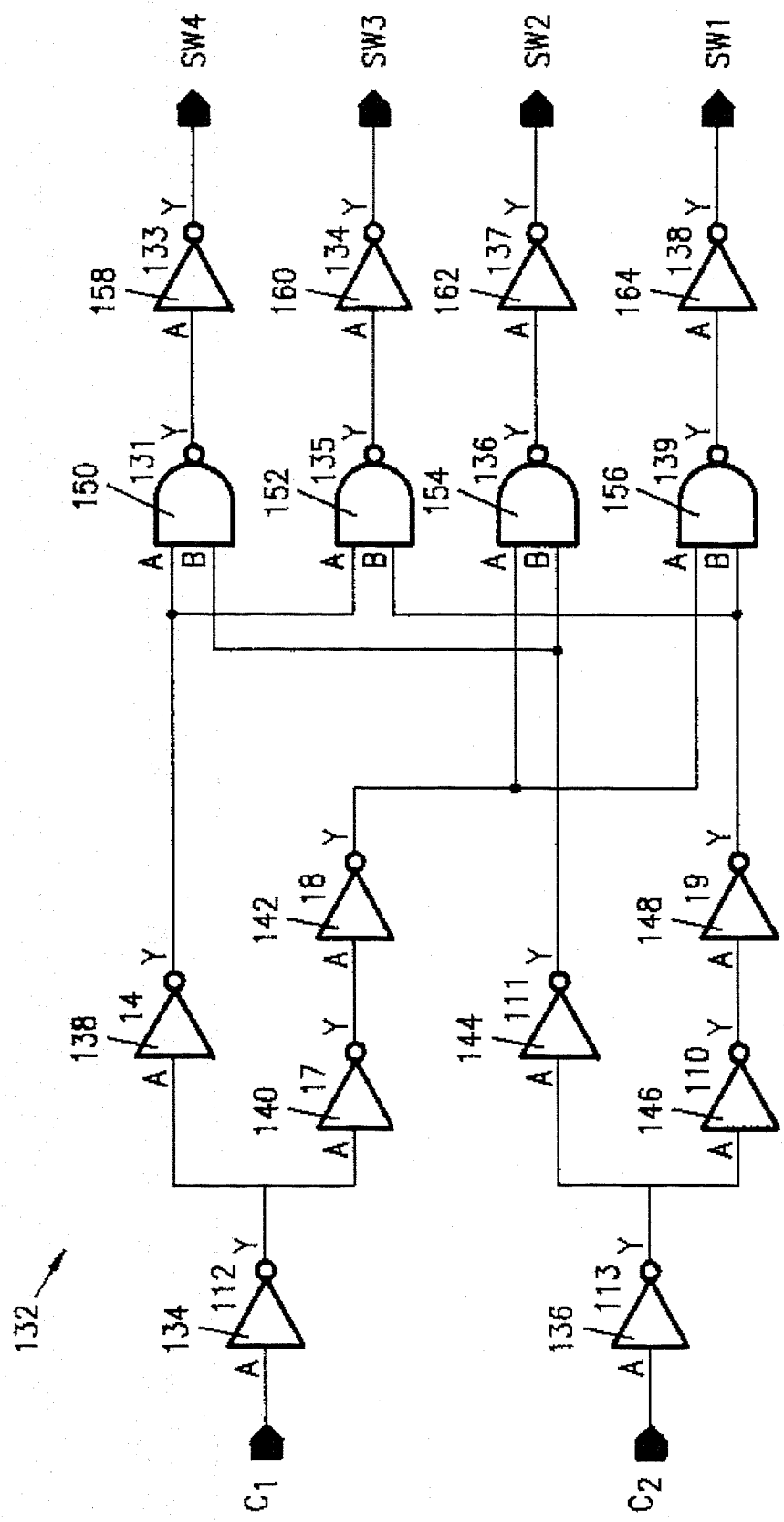
FIG. 17 is a schematic diagram illustrating control logic circuitry that may be used for programming the temperature compensation circuit shown in FIG. 16.

Transistors M266, M270, M274, and M278 of the circuit 122/124 may be controlled by the control logic circuitry 132 shown in FIG. 17. The design and operation of the control logic circuitry 132 is similar to the control logic circuitry shown in FIG. 7A and described above. The control logic circuitry 132 is used to program transistors M266, M270, M274, and M278 so that only one of transistors M264, M268, M272, and M276 conducts current at a time. The control logic circuitry 132 includes two inverters 134 and 136 that receive at their inputs control signals C1 and C2, respectively. The output of inverter 134 is coupled to the input of an inverter 138 and the input of series connected inverters 140 and 142. The output of inverter 136 is coupled to the input of an inverter 144 and the input of series connected inverters 146 and 148.

Four NAND gates 150, 152, 154, and 156 receive the outputs of inverters 138, 142, 144, and 148. Specifically, NAND gate 150 receives the outputs of inverters 138 and 144, NAND gate 152 receives the outputs of inverters 138 and 148, NAND gate 154 receives the outputs of inverters 142 and 144, and NAND gate 156 receives the outputs of inverters 142 and 148. NAND gates 150, 152, 154, and 156 have their outputs coupled to inverters 158, 160, 162, and 164, respectively.

Referring back to FIG. 15, transistors M212 and M214 of the first falling edge speed-up circuit 114 have channel widths of 80 µm and channel lengths of 1 µm. Furthermore, transistor M216 has a channel width of 40 µm and a channel length of 1 µm, and transistor 54218 has a channel width of 60 µm and a channel length of 1 µm. The current source 128 is connected in series with transistor M216 with a p-channel transistor M298 which has a channel width of 150 µm and a channel length of 1 µm. Transistor M298 is controlled by a negative temperature coefficient current source 166 and a rising edge speed-up control circuit 168. The negative temperature coefficient current source 166 and the rising edge speed-up control circuit 168 form both of the current sources 128 and 130.

Transistor M228 of the rising edge speed-up control circuit 118 has a channel width of 140 µm and a channel length of 1 µm, and transistor M226 has a channel width of 150 µm and a channel length of 1 µm. Furthermore, transistors M230 and M232 have channel widths of 40 µm and channel lengths of 1 µm. The current source 130 is implemented with the negative temperature coefficient current source 166 and the rising edge speed-up control circuit 168. Thus, the current $I_{S4}$ is generated by the negative temperature coefficient current source 166 and the rising edge speed-up control circuit 168.

Figure 18:
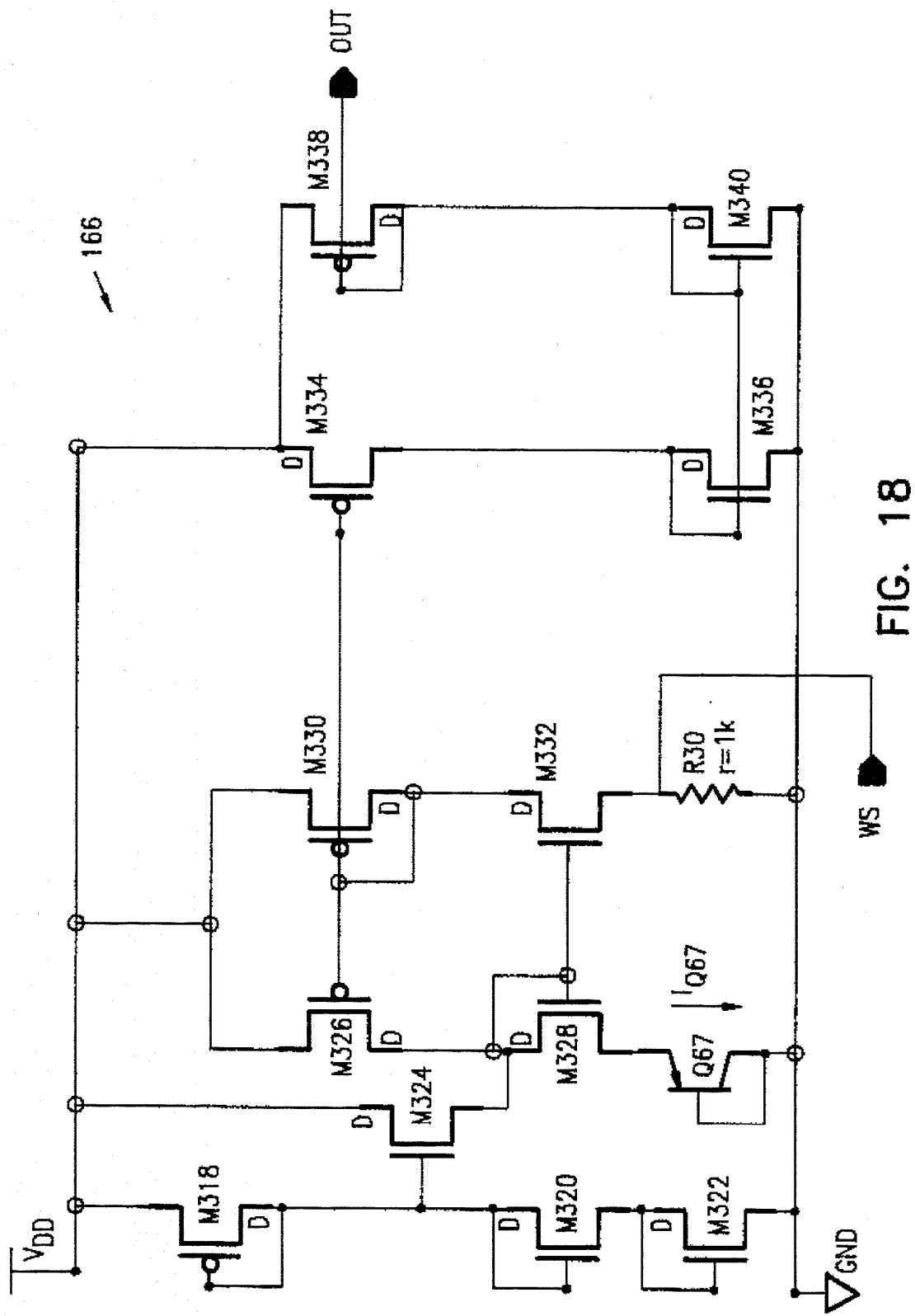
FIG. 18 is a schematic diagram illustrating a negative temperature coefficient current source that may be used with the transmission line driver shown in FIG. 15.

FIG. 18 shows the negative temperature coefficient current source 166. When temperature increases, the current conducted by a p-channel transistor having its gate connected to the output of the current source 166 will decrease. The design of the current source 166 is similar to that of the current generation stage 42 described above. Specifically, two p-channel transistors M326 and M330 maintain equal currents through two n-channel transistors M328 and M332. Transistors M326 and M330 have channel widths of 200 µm and channel lengths of 2 µm, transistor M328 has a channel width of 200 µm and a channel length of 1 µm, and transistor M332 has a channel width of 40 µm and a channel length of 1 µm. Furthermore, a 1 KΩ resistor R30 is connected in series with the source of transistor M332. However, unlike the current generation stage 42 described above, a diode connected pnp bipolar transistor Q67 is connected in series with the source of transistor M328.

It is known that the emitter-base voltage of a bipolar transistor has a negative temperature coefficient. Therefore, as temperature increases, the emitter-base voltage of transistor Q67 decreases. This causes a decrease in the voltage across resistor R30. When the voltage across resistor R30 decreases, the current conducted by transistor M332 decreases. Because the currents conducted by transistors M332 and M328 are maintained equal by transistors M326 and M330, a decrease in the current conducted by transistor M332 results in a decrease in the current $I_{Q67}$ conducted by the bipolar pnp transistor Q67. This causes the current conducted by transistor M326 to also decrease. Through the current mirror action, the currents conducted by transistors M330, M334, and M338 also decrease. Therefore, the current conducted by any p-channel transistor connected to the gate of transistor M338 will also decrease when temperature increases.

Figure 19:
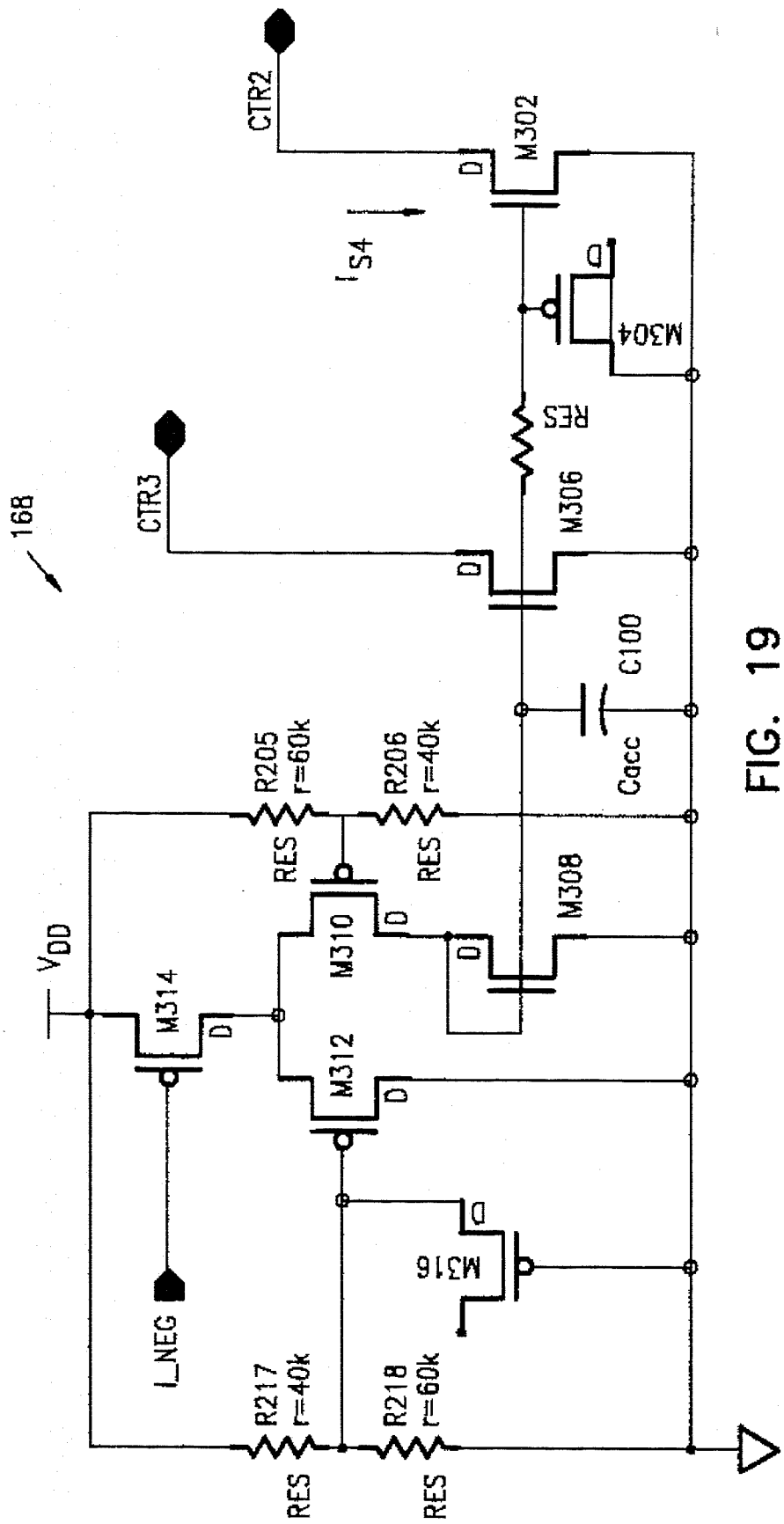
FIG. 19 is a schematic diagram illustrating a rising edge speed-up control circuit that may be used with the transmission line driver shown in FIG. 15.

FIG. 19 shows the rising edge speed-up control circuit 168. The purpose of the rising edge speed-up control circuit 168 is to cause the currents and $I_{S4}$ to have negative voltage supply $V_{CC}$ coefficients. In other words, when the voltage supply $V_{CC}$ increases, the currents $I_{S2}$ and $I_{S4}$ decrease. It is desirable for the current $I_{S4}$ to have a negative voltage supply coefficient in order to offset the effects of an increase in the supply voltage $V_{CC}$. If the supply voltage $V_{CC}$ increases, then the voltage $V_g$ will also increase when it is at its high level. When the voltage $V_g$ increases, it is necessary for the current pulse $I_{S5}$ to be wider, i.e., the current $I_{S5}$ to be conducted for a longer period of time, in order to discharge the voltage $V_g$ the extra amount caused by the increased voltage $V_{CC}$. In order to make the current pulse $I_{S5}$ wider, the current $I_{S4}$ must be smaller so that transistor M226 does not shut off as quickly. Therefore, when the voltage $V_{CC}$ increases, the current $I_{S4}$ should be decreased.

The rising edge speed-up control circuit 168 includes a p-channel transistor M314 that receives at its gate the output of the negative temperature coefficient current source 166. The drain of transistor M314 is connected to the sources of two p-channel transistors M310 and M312. The gate of transistor M312 is connected to a voltage divider circuit that includes a 40 KΩ resistor R217 and a 60 KΩ resistor R218. The gate of transistor M310 is connected to a voltage divider circuit that includes a 60 KΩ resistor R205 and a 40 KΩ resistor R206. An n-channel transistor M308 is connected in series with the drain of transistor M310. The gate of transistor M308 is connected to the gates of two n-channel mirror transistors M306 and M302. The current $I_{S4}$ is conducted by transistor M302. The drain of transistor M306 is connected to the gates of transistors M298 and M300 in the first falling edge speed-up circuit 114. Transistor M298 conducts the current $I_{S2}$. In addition, a capacitor C100 is connected between the gate of transistor M306 and ground.

Preferably, transistor M314 has a channel width of 150 μm and a channel length of 2 μm, transistors M310 and M312 have channel widths of 80 μm and channel lengths of 1 μm, transistors M308 and M306 have channel widths of 40 μm and channel lengths of 1 μm, and transistor M302 has a channel width of 160 μm and a channel length of 1 μm.

During operation, transistor M314 conducts a current having a negative temperature coefficient due to its connection to the negative temperature coefficient current source 166. The current conducted by transistor M314 is split among transistors M312 and M310. When the voltage supply $V_{CC}$ increases, the voltage across resistors R218 and R206 increases. This raises the gate voltage of each of the transistors M312 and M310, and, because resistors R218 and R206 have different values, the difference between the source-gate voltages of transistors M312 and M310 increases. Because the gate voltages are brought closer to the source voltages, transistors M312 and M310 conduct less current. The current $I_{S4}$ conducted by transistor M302, as well as the current $I_{S2}$, is proportional to the current conducted by transistor M310 because of the mirror connection of transistor M302. Therefore, when the voltage supply $V_{CC}$ increases, the currents $I_{S4}$ and $I_{S2}$ decrease.

Figure 20:
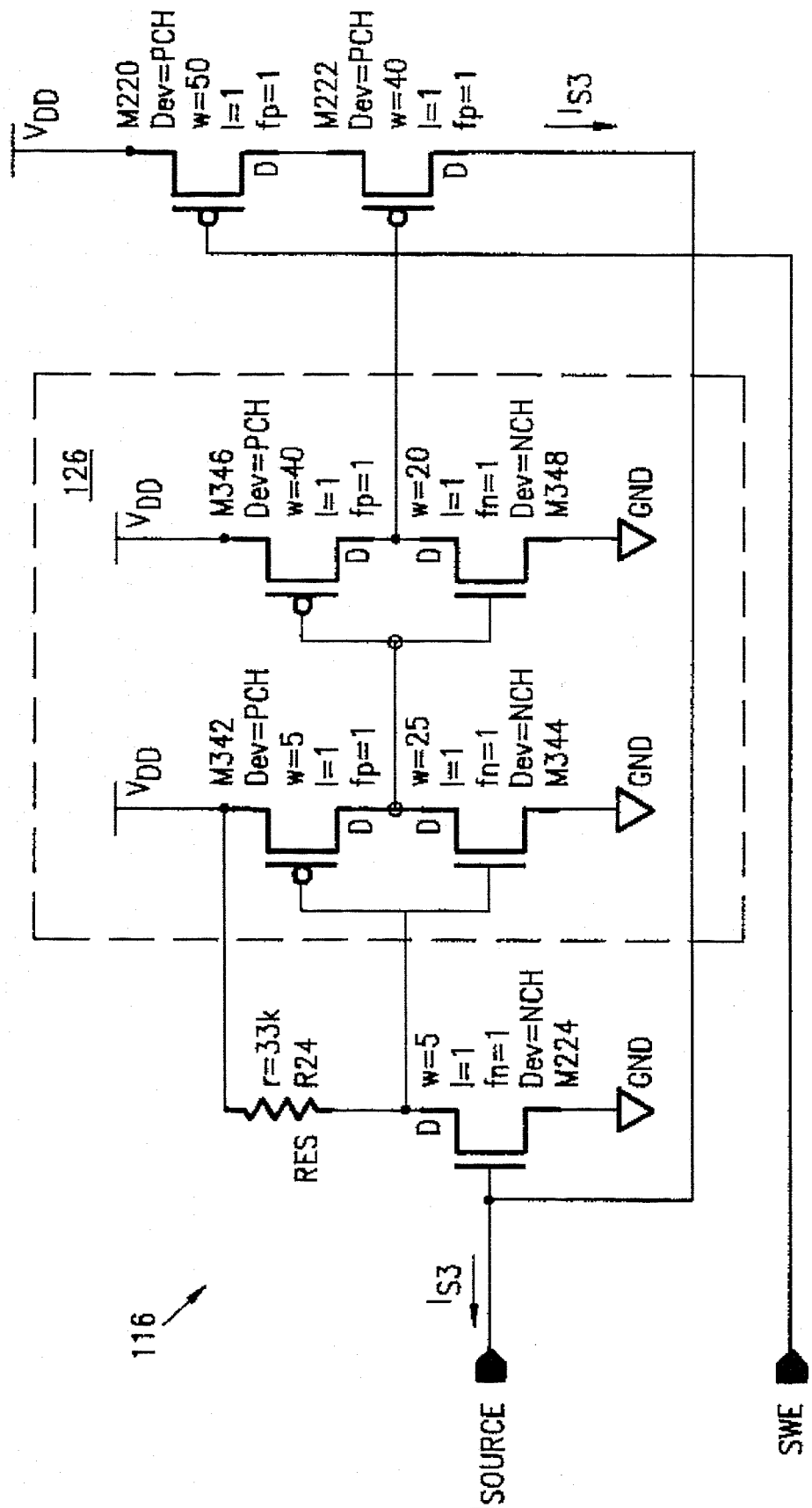
FIG. 20 is a schematic diagram illustrating a gate charging speed-up circuit that may be used with the transmission line driver shown in FIG. 15.

FIG. 20 shows the gate charging speed-up circuit 116 in detail. The two inverters 126 are implemented with a p-channel transistor M342 and an n-channel transistor M344 which form one inverter and a p-channel transistor M346 and an n-channel transistor M348 which form the second inverter. The resistor R24 has a value of 33 KΩ. As mentioned above, the sensing transistor M224 has a channel width of 5 μm and a channel length of 1 μm. Transistor M220 has a channel width of 50 μm and a channel length of 1 μm, and transistor M222 has a channel width of 40 μm and a channel length of 1 μm. Furthermore, transistor M342 has a channel width of 5 μm and a channel length of 1 μm, transistor M344 has a channel width of 25 μm and a channel length of 1 μm, transistor M346 has a channel width of 40 μm and a channel length of 1 μm, and transistor M348 has a channel width of 20 μm and a channel length of 1 μm.

Figure 21A:
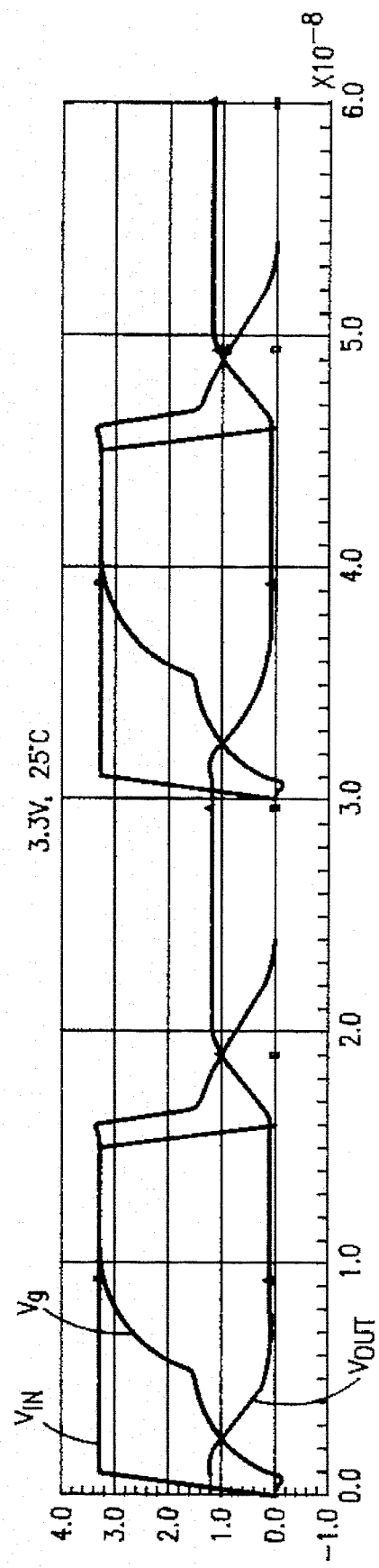
FIGS. 21A–21C are timing diagrams illustrating some of the signal levels generated by the transmission line driver shown in FIG. 15.
Figure 21B:
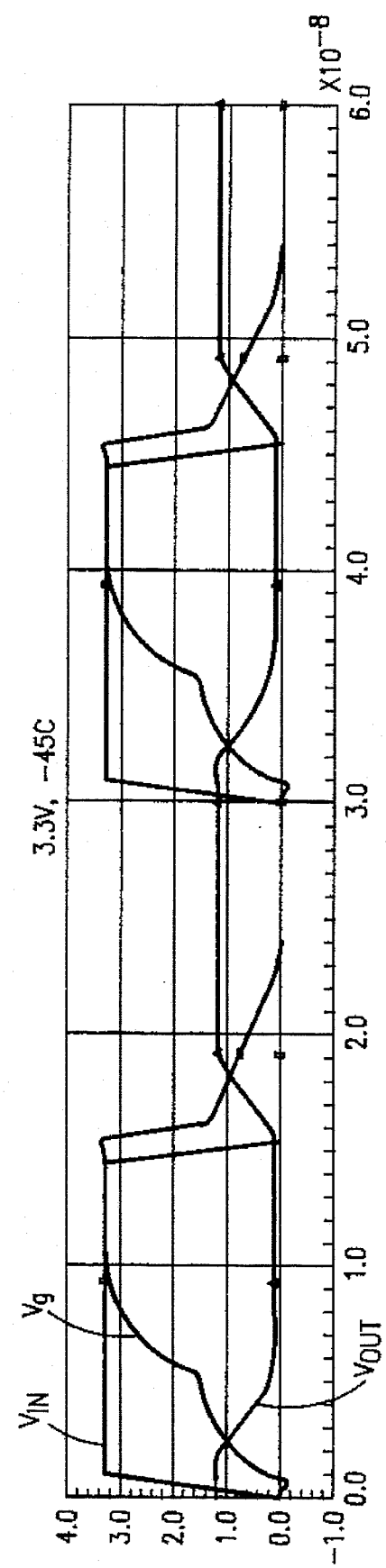
Figure 21C:
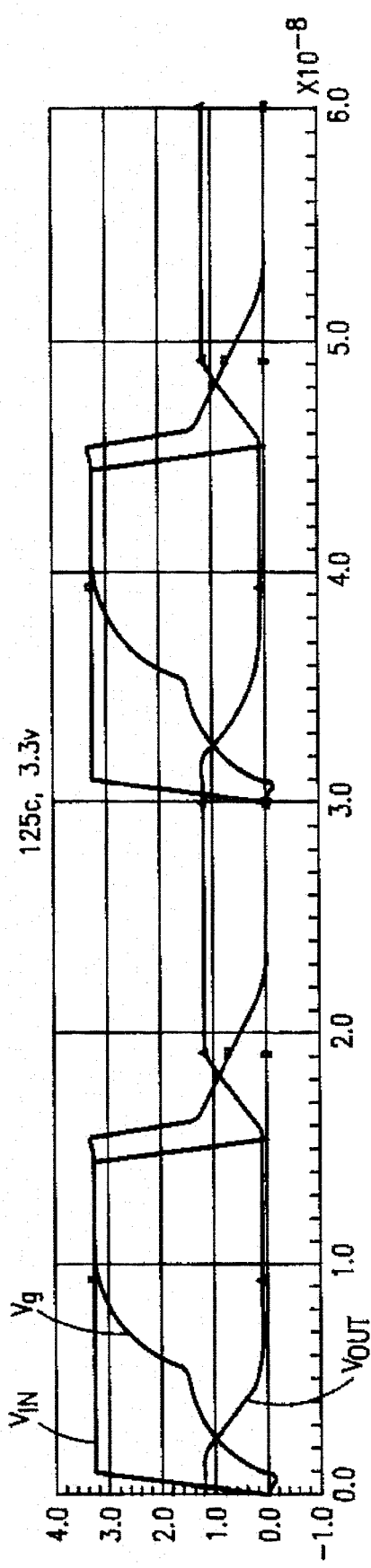

FIGS. 21A through 21C illustrate actual waveforms for the input $V_{in}$, the voltage $V_g$, and the output $V_{out}$ for the driver 110 shown in FIG. 11. The waveforms illustrate the performance of the driver 110 for a supply voltage $V_{CC}$ of 3.3 Volts and a variety of temperatures. Specifically, the waveforms of FIG. 21A were measured at 25° C., the waveforms of FIG. 21B were measured at −45° C., and the waveforms of FIG. 21C were measured at 125° C. The waveforms illustrate that the input $V_{in}$, the voltage $V_g$, and the output $V_{out}$ do not vary significantly with variations in temperature. This is due to the temperature compensation provided by the current sources 122, 124, 128, and 130.

Figure 22:
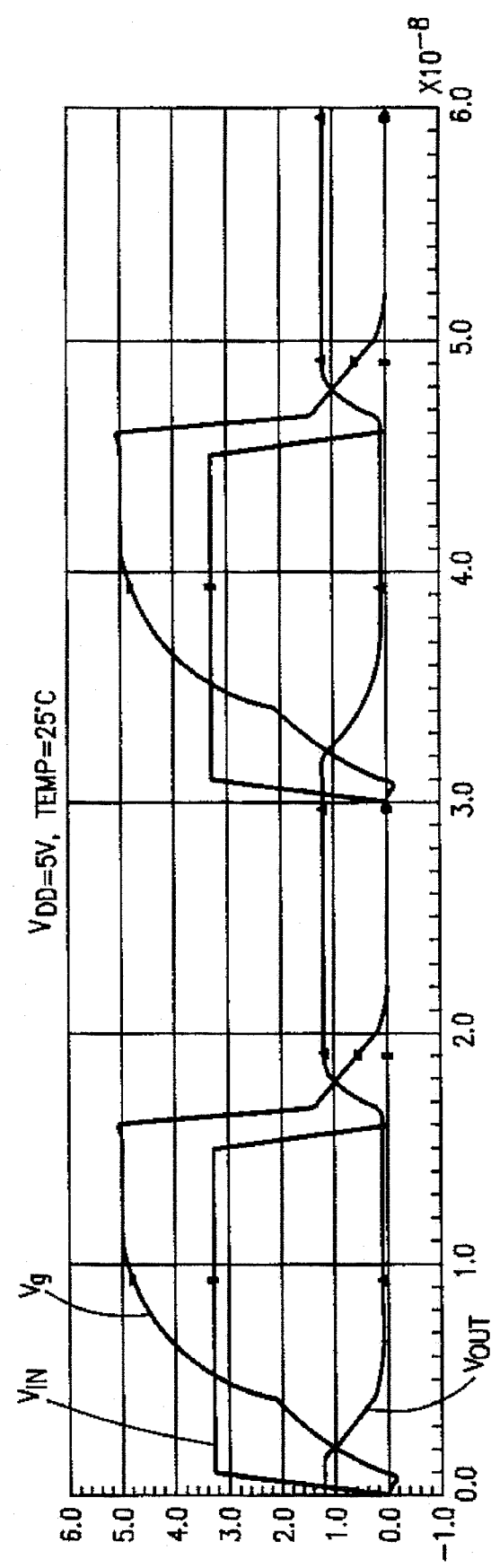
FIG. 22 is a timing diagram illustrating some of the signal levels generated by the transmission line driver shown in FIG. 15.

FIG. 22 illustrates actual waveforms for the input $V_{in}$, the voltage $V_g$, and the output $V_{out}$ for the driver 110 at 25° C. for a supply voltage $V_{CC}$ of 5 Volts. Although the voltage $V_g$ rises all the way to 5 Volts, the output $V_{out}$ remains at about the same level as that shown in FIGS. 21A through 21C. Thus, the negative voltage supply coefficient of the rising edge speed-up control circuit 168 compensates for variations in the supply voltage $V_{CC}$.

The driver 110 shown in FIGS. 11 and 15 has the advantage that the edge rate of the falling and rising edge of the output $V_{out}$ is programmable. One way of adjusting the edge rate is to change the inputs C1 and C2 of the control logic circuitry 132 shown in FIG. 17. This changes the strength of the currents generated in the temperature compensation circuit 122/124 which results in a change in the strength of the currents $I_{on}$ and $I_{off}$. By changing the strength of the currents $I_{on}$ and $I_{off}$ the rate at which the output transistor M206 is charged and discharged is changed which directly affects the edge rate.

Another way to adjust the edge rate of the falling and rising edge of the output $V_{out}$ is to adjust the length of time that the currents $I_{S1}$, $I_{S3}$, and $I_{S5}$ are on. As discussed above, the currents $I_{S1}$ and $I_{S5}$ can be adjusted by adjusting the currents and $I_{S4}$, respectively, which are controlled by the current sources 128 and 130, respectively.

The present invention also includes a method of charging the gate of an output transistor of a driver which provides binary signals from a data system to a transmission line. The method generally includes the steps of: (1) providing a first charging current to the gate of the output transistor for a first charging time period during which the voltage level of the gate of the output transistor increases from ground level to a first voltage supply level; (2) providing a second charging current to the gate of the output transistor for a second charging time period beginning when the first charging time period begins and ending when the voltage level of the gate of the output transistor increases to approximately its threshold voltage level; and (3) providing a third charging current to the gate of the output transistor for a third charging time period beginning when the voltage level of the drain of the output transistor decreases to a low logic level and ending when the voltage level of the gate of the output transistor increases to approximately the first voltage supply level.

A method of discharging the gate of an output transistor of a driver which provides binary signals from a data system to a transmission line generally includes the steps of: (1) providing a first discharging current for discharging the gate of the output transistor for a first discharging time period during which the voltage of the gate of the output transistor decreases from a first voltage supply level down to ground level; and (2) providing a second discharging current for discharging the gate of the output transistor for a second discharging time period during which the voltage level of the gate of the output transistor decreases from the first voltage supply level down to approximately the threshold voltage level of the output transistor.

Although the embodiment of the present invention shown in FIGS. 5–9, 11, and 15–20 utilizes MOSFETs, it is envisioned that the present invention may also be used in connection with other technologies, such as junction FETs (JFETs) or Gallium Arsenide (GaAs).

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A driver for providing binary signals from a data system to a transmission line, the driver comprising:

an output transistor having its drain-source circuit connectable between the transmission line and ground, the channel of the output transistor having a width that is greater than its length;

an input stage for providing a first charging current to the gate of the output transistor for a first charging time period during which the voltage level of the gate of the output transistor increases from ground level to a first voltage supply level, the input stage also providing a first discharging current for discharging the gate of the output transistor for a first discharging time period during which the voltage of the gate of the output transistor decreases from the first voltage supply level down to ground level;

a first falling edge speed-up circuit for providing a second charging current to the gate of the output transistor for a second charging time period beginning when the first charging time period begins and ending when the voltage level of the gate of the output transistor increases to approximately its threshold voltage level; and a rising edge discharge circuit for providing a second discharging current for discharging the gate of the output transistor for a second discharging time period during which the voltage level of the gate of the output transistor decreases from the first voltage supply level down to approximately the threshold voltage level of the output transistor, the rising edge discharge circuit including first and second series connected transistors coupled between the gate of the output transistor and ground which are switched into simultaneous conducting states for a length of time approximately equal to the second discharging time period in order to conduct the second discharging current.

2. A driver for providing binary signals from a data system to a transmission line, the driver comprising:

an output transistor having its drain-source circuit connectable between the transmission line and ground, the channel of the output transistor having a width that is greater than its length;

an input stage for providing a first charging current to the gate of the output transistor for a first charging time period during which the voltage level of the gate of the output transistor increases from ground level to a first voltage supply level, the input stage also providing a first discharging current for discharging the gate of the output transistor for a first discharging time period during which the voltage of the gate of the output transistor decreases from the first voltage supply level down to ground level;

a first falling edge speed-up circuit for providing a second charging current to the gate of the output transistor for a second charging time period beginning when the first charging time period begins and ending when the voltage level of the gate of the output transistor increases to approximately its threshold voltage level, the first falling edge speed-up circuit including first and second series connected transistors coupled between the first voltage supply level and the gate of the output transistor which are switched into simultaneous conducting states for a length of time approximately equal to the second charging time period in order to conduct the second charging current; and a first temperature and voltage supply compensation circuit coupled to the input stage for adjusting the level of the first charging and discharging currents to compensate for variations in temperature and voltage supply.

3. A driver for providing binary signals from a data system to a transmission line, the driver comprising:

an output transistor having its drain-source circuit connectable between the transmission line and ground, the channel of the output transistor having a width that is greater than its length;

an input stage for providing a first charging current to the gate of the output transistor for a first charging time period during which the voltage level of the gate of the output transistor increases from ground level to a first voltage supply level, the input stage also providing a first discharging current for discharging the gate of the output transistor for a first discharging time period during which the voltage of the gate of the output transistor decreases from the first voltage supply level down to ground level;

a first falling edge speed-up circuit for providing a second charging current to the gate of the output transistor for a second charging time period beginning when the first charging time period begins and ending when the voltage level of the gate of the output transistor increases to approximately its threshold voltage level; and a rising edge discharge circuit for providing a second discharging current for discharging the gate of the output transistor for a second discharging time period during which the voltage level of the gate of the output transistor decreases from the first voltage supply level down to approximately the threshold voltage level of the output transistor;

wherein the first falling edge speed-up circuit includes:
first and second series connected p-channel transistors coupled between the first voltage supply and the gate of the output transistor for conducting the second charging current; and a first switching circuit for switching the first and second p-channel transistors into simultaneous conducting states for a length of time approximately equal to the second charging time period.

4. A driver for providing binary signals from a data system to a transmission line, the driver comprising:

an output transistor having its drain-source circuit connectable between the transmission line and ground, the channel of the output transistor having a width that is greater than its length;

an input stage for providing a first charging current to the gate of the output transistor for a first charging time period during which the voltage level of the gate of the output transistor increases from ground level to a first voltage supply level, the input stage also providing a first discharging current for discharging the gate of the output transistor for a first discharging time period during which the voltage of the gate of the output transistor decreases from the first voltage supply level down to ground level; and a first falling edge speed-up circuit for providing a second charging current to the gate of the output transistor for a second charging time period beginning when the first charging time period begins and ending when the voltage level of the gate of the output transistor increases to approximately its threshold voltage level;

wherein the first falling edge speed-up circuit includes:
first and second series connected p-channel transistors coupled between the first voltage supply and the gate of the output transistor for conducting the second charging current; and a first switching circuit for switching the first and second p-channel transistors into simultaneous conducting states for a length of time approximately equal to the second charging time period;

wherein the first switching circuit includes:

a first current source for charging the gate of the first p-channel transistor in order to switch it out of the conducting state, the first current source having a negative temperature coefficient and a negative voltage supply coefficient.

5. A driver for providing binary signals from a data system to a transmission line, the driver comprising:

an output transistor having its drain-source circuit connectable between the transmission line and ground, the channel of the output transistor having a width that is greater than its length;

an input stage for providing a first charging current to the gate of the output transistor for a first charging time period during which the voltage level of the gate of the output transistor increases from ground level to a first voltage supply level, the input stage also providing a first discharging current for discharging the gate of the output transistor for a first discharging time period during which the voltage of the gate of the output transistor decreases from the first voltage supply level down to ground level; and a gate charging speed-up circuit for providing a second charging current to the gate of the output transistor for a second charging time period beginning when the voltage level of the drain of the output transistor decreases to a low logic level and ending when the voltage level of the gate of the output transistor increases to approximately the first voltage supply level, the gate charging speed-up circuit including first and second series connected transistors coupled between the first voltage supply level and the gate of the output transistor which are switched into simultaneous conducting states for a length of time approximately equal to the second charging time period in order to conduct the second charging current.

6. A driver according to claim 5, further comprising:

a first temperature and voltage supply compensation circuit coupled to the input stage for adjusting the level of the first charging and discharging currents to compensate for variations in temperature and voltage supply.

7. A driver for providing binary signals from a data system to a transmission line, the driver comprising:

an output transistor having its drain-source circuit connectable between the transmission line and ground, the channel of the output transistor having a width that is greater than its length;

an input stage for providing a first charging current to the gate of the output transistor for a first charging time period during which the voltage level of the gate of the output transistor increases from ground level to a first voltage supply level, the input stage also providing a first discharging current for discharging the gate of the output transistor for a first discharging time period during which the voltage of the gate of the output transistor decreases from the first voltage supply level down to ground level; and a gate charging speed-up circuit for providing a second charging current to the gate of the output transistor for a second charging time period beginning when the voltage level of the drain of the output transistor decreases to a low logic level and ending when the voltage level of the gate of the output transistor increases to approximately the first voltage supply level;

wherein the gate charging speed-up circuit includes:

first and second series connected p-channel transistors coupled between the first voltage supply and the gate of the output transistor for conducting the second charging current; and a first switching circuit for switching the first and second p-channel transistors into simultaneous conducting states for a length of time approximately equal to the second charging time period.

8. A driver according to claim 7, wherein the first switching circuit comprises:

a sensing transistor having its gate coupled to the gate of the output transistor for sensing when the drain of the output transistor decreases to a low logic level, the voltage level of the drain of the sensing transistor being used to switch the second p-channel transistor into the conducting state.

9. A driver for providing binary signals from a data system to a transmission line, the driver comprising:

an output transistor having its drain-source circuit connectable between the transmission line and ground, the channel of the output transistor having a width that is greater than its length;

an input stage for providing a first charging current to the gate of the output transistor for a first charging time period during which the voltage level of the gate of the output transistor increases from ground level to a first voltage supply level, the input stage also providing a first discharging current for discharging the gate of the output transistor for a first discharging time period during which the voltage of the gate of the output transistor decreases from the first voltage supply level down to ground level; and a rising edge discharge circuit for providing a second discharging current for discharging the gate of the output transistor for a second discharging time period during which the voltage level of the gate of the output transistor decreases from the first voltage supply level down to approximately the threshold voltage level of the output transistor, the rising edge discharge circuit including first and second series connected transistors coupled between the gate of the output transistor and ground which are switched into simultaneous conducting states for a length of time approximately equal to the second discharging time period in order to conduct the second discharging current.

10. A driver according to claim 9, wherein the first and second series connected transistors comprise n-channel transistors and wherein the rising edge discharge circuit further comprises:

a first switching circuit for switching the first and second connected transistors into simultaneous conducting states for a length of time approximately equal to the second discharging time period.

11. A driver for providing binary signals from a data system to a transmission line, the driver comprising:

an output transistor having its drain-source circuit connectable between the transmission line and ground, the channel of the output transistor having a width that is greater than its length;

an input stage for providing a first charging current to the gate of the output transistor for a first charging time period during which the voltage level of the gate of the output transistor increases from ground level to a first voltage supply level, the input stage also providing a first discharging current for discharging the gate of the output transistor for a first discharging time period during which the voltage of the gate of the output transistor decreases from the first voltage supply level down to ground level; and a rising edge discharge circuit for providing a second discharging current for discharging the gate of the output transistor for a second discharging time period during which the voltage level of the gate of the output transistor decreases from the first voltage supply level down to approximately the threshold voltage level of the output transistor;

wherein the rising edge discharge circuit includes:
third and fourth series connected n-channel transistors coupled between the gate of the output transistor and ground for conducting the second discharging current; and a first switching circuit for switching the third and fourth n-channel transistors into simultaneous conducting states for a length of time approximately equal to the second discharging time period;

wherein the first switching circuit includes:
a first current source for discharging the gate of the third n-channel transistor in order to switch it out of the conducting state, the first current source having a negative temperature coefficient and a negative voltage supply coefficient.

12. A driver according to claim 11, wherein the first current source discharges the gate of the third n-channel transistor from the first voltage supply level down to the threshold level of the third n-channel transistor in an amount of time approximately equal to the second discharging time period, whereby the output transistor and the third n-channel transistor reach their respective threshold levels at the same time.

13. A driver for providing binary signals from a data system to a transmission line, the driver comprising:

an output transistor having its drain-source circuit connectable between the transmission line and ground, the channel of the output transistor having a width that is greater than its length;

an input stage for providing a first charging current to the gate of the output transistor for a first charging time period during which the voltage level of the gate of the output transistor increases from ground level to a first voltage supply level, the input stage also providing a first discharging current for discharging the gate of the output transistor for a first discharging time period during which the voltage of the gate of the output transistor decreases from the first voltage supply level down to ground level;

a first falling edge speed-up circuit for providing a second charging current to the gate of the output transistor for a second charging time period beginning when the first charging time period begins and ending when the voltage level of the gate of the output transistor increases to approximately its threshold voltage level;

a gate charging speed-up circuit for providing a third charging current to the gate of the output transistor for a third charging time period beginning when the voltage level of the drain of the output transistor decreases to a low logic level and ending when the voltage level of the gate of the output transistor increases to approximately the first voltage supply level; and a rising edge discharge circuit for providing a second discharging current for discharging the gate of the output transistor for a second discharging time period during which the voltage level of the gate of the output transistor decreases from the first voltage supply level down to approximately the threshold voltage level of the output transistor.

14. A driver according to claim 13, further comprising:
a first temperature and voltage supply compensation circuit coupled to the input stage for adjusting the level of the first charging and discharging currents to compensate for variations in temperature and voltage supply.

15. A method of charging the gate of an output transistor of a driver which provides binary signals from a data system to a transmission line, the method comprising the steps of:

providing a first charging current to the gate of the output transistor for a first charging time period during which the voltage level of the gate of the output transistor increases from ground level to a first voltage supply level;

providing a second charging current to the gate of the output transistor for a second charging time period beginning when the first charging time period begins and ending when the voltage level of the gate of the output transistor increases to approximately its threshold voltage level; and providing a third charging current to the gate of the output transistor for a third charging time period beginning when the voltage level of the drain of the output transistor decreases to a low logic level and ending when the voltage level of the gate of the output transistor increases to approximately the first voltage supply level.

16. A method according to claim 15, wherein the step of providing the second charging current is performed with first and second series connected p-channel transistors coupled between the first voltage supply and the gate of the output transistor for conducting the second charging current and a first switching circuit for switching the first and second p-channel transistors into simultaneous conducting states for a length of time approximately equal to the second charging time period.

17. A method according to claim 15, wherein the step of providing the third charging current is performed with third and fourth series connected p-channel transistors coupled between the first voltage supply and the gate of the output transistor for conducting the third charging current and a second switching circuit for switching the third and fourth p-channel transistors into simultaneous conducting states for a length of time approximately equal to the third charging time period.

18. A method of discharging the gate of an output transistor of a driver which provides binary signals from a data system to a transmission line, the method comprising the steps of:

providing a first discharging current for discharging the gate of the output transistor for a first discharging time period during which the voltage of the gate of the output transistor decreases from a first voltage supply level down to ground level; and providing a second discharging current for discharging the gate of the output transistor for a second discharging time period during which the voltage level of the gate of the output transistor decreases from the first voltage supply level down to approximately the threshold voltage level of the output transistor, the second discharging current being conducted by first and second series connected transistors which are switched into simultaneous conducting states for a length of time approximately equal to the second discharging time period.

19. A method according to claim 18, wherein the first and second series connected transistors are n-channel transistors that are coupled between the gate of the output transistor and ground for conducting the second discharging current and wherein a first switching circuit switches the first and second series connected transistors into simultaneous conducting states for a length of time approximately equal to the second discharging time period.

20. A method of discharging the gate of an output transistor of a driver which provides binary signals from a data system to a transmission line, the method comprising the steps of:

providing a first discharging current for discharging the gate of the output transistor for a first discharging time period during which the voltage of the gate of the output transistor decreases from a first voltage supply level down to ground level; and providing a second discharging current for discharging the gate of the output transistor for a second discharging time period during which the voltage level of the gate of the output transistor decreases from the first voltage supply level down to approximately the threshold voltage level of the output transistor;

wherein the step of providing the second discharging current is performed with third and fourth series connected n-channel transistors coupled between the gate of the output transistor and ground for conducting the second discharging current and a first switching circuit for switching the third and fourth n-channel transistors into simultaneous conducting states for a length of time approximately equal to the second discharging time period;

wherein the first switching circuit includes:
a first current source for discharging the gate of the third n-channel transistor in order to switch it out of the conducting state, the first current source having a negative temperature coefficient and a negative voltage supply coefficient.

21. A method according to claim 20, wherein the first current source discharges the gate of the third n-channel transistor from the first voltage supply level down to the threshold level of the third n-channel transistor in an amount of time approximately equal to the second discharging time period, whereby the output transistor and the third n-channel transistor reach their respective threshold levels at the same time.

* * * * *

UNITED STATES PATENT AND TRADEMARK OFFICE
CERTIFICATE OF CORRECTION

PATENT NO. : 5,539,341
DATED : July 23, 1996
INVENTOR(S) : James R. Kuo

It is certified that error appears in the above-indentified patent and that said Letters Patent is hereby corrected as shown below:

In col. 32, line 56, before the word "connected" insert --series--.

Signed and Sealed this

Eighth Day of October, 1996

Attest:

BRUCE LEHMAN

Attesting Officer     Commissioner of Patents and Trademarks